United States Patent
Snyder

(10) Patent No.: US 10,878,140 B2
(45) Date of Patent: Dec. 29, 2020

(54) PLANT BUILDER SYSTEM WITH INTEGRATED SIMULATION AND CONTROL SYSTEM CONFIGURATION

(71) Applicant: EMERSON PROCESS MANAGEMENT POWER & WATER SOLUTIONS, INC., Pittsburgh, PA (US)

(72) Inventor: Jeffrey Thomas Snyder, Tarentum, PA (US)

(73) Assignee: EMERSON PROCESS MANAGEMENT POWER & WATER SOLUTIONS, INC., Pittsburgh, PA (US)

(*) Notice: Subject to any disclaimer, the term of this patent is extended or adjusted under 35 U.S.C. 154(b) by 646 days.

(21) Appl. No.: 15/221,096

(22) Filed: Jul. 27, 2016

(65) Prior Publication Data
US 2018/0032651 A1    Feb. 1, 2018

(51) Int. Cl.
*G06F 30/18* (2020.01)
*G06F 30/13* (2020.01)
*G06F 30/20* (2020.01)

(52) U.S. Cl.
CPC .............. *G06F 30/18* (2020.01); *G06F 30/13* (2020.01); *G06F 30/20* (2020.01); *Y02P 90/26* (2015.11); *Y02P 90/265* (2015.11)

(58) Field of Classification Search
CPC . G06F 17/509; G06F 17/5004; G06F 17/5009
USPC .......................................................... 703/1
See application file for complete search history.

(56) References Cited

U.S. PATENT DOCUMENTS

| RE30,280 E | 5/1980 | Berman et al. |
|---|---|---|
| 4,316,952 A | 2/1982 | Wendling |
| 4,506,324 A | 3/1985 | Healy |
| 4,512,747 A | 4/1985 | Hitchens et al. |
| 4,546,649 A | 10/1985 | Kantor |
| 4,613,952 A | 9/1986 | McClanahan |

(Continued)

FOREIGN PATENT DOCUMENTS

| CN | 1598720 A | 3/2005 |
|---|---|---|
| DE | 197 40 972 C1 | 3/1999 |

(Continued)

OTHER PUBLICATIONS

Mario Hoernicke et al., "System and Method for a Human Machine Interface based Automatic Generation of Process Simulation Models", An IP.com Prior Art Database Technical Disclosure, IP.com No. IPCOM000212470D IP.com Electronic Publication Date: Nov. 14, 2011 (Year: 2011).*

(Continued)

*Primary Examiner* — Justin C Mikowski
(74) *Attorney, Agent, or Firm* — Marshall, Gerstein & Borun LLP

(57) ABSTRACT

The described methods and systems enable iterative plant design. These methods and systems may be utilized to test multiple P&ID designs and control strategies before a plant is constructed, enabling engineers to test physical layouts and control strategies for the particular unit, facilitating optimal design of the plant and control scheme for controlling the process. The described methods and system thus facilitate optimal design of optimal physical layouts and control strategies.

15 Claims, 8 Drawing Sheets

(56) References Cited

U.S. PATENT DOCUMENTS

| | | | |
|---|---|---|---|
| 4,628,435 A | 12/1986 | Tashiro et al. |
| 4,663,704 A | 5/1987 | Jones et al. |
| 4,736,320 A | 4/1988 | Bristol |
| 4,885,717 A | 12/1989 | Beck et al. |
| 4,972,328 A | 11/1990 | Wu et al. |
| 4,977,529 A | 12/1990 | Gregg et al. |
| 5,014,208 A | 5/1991 | Wolfson |
| 5,021,947 A | 6/1991 | Campbell et al. |
| 5,041,964 A | 8/1991 | Cole et al. |
| 5,051,898 A | 9/1991 | Wright et al. |
| 5,079,731 A | 1/1992 | Miller et al. |
| 5,092,449 A | 3/1992 | Bolin et al. |
| 5,097,412 A | 3/1992 | Orimo et al. |
| 5,119,468 A | 6/1992 | Owens |
| 5,159,685 A | 10/1992 | Kung |
| 5,168,441 A | 12/1992 | Onarheim et al. |
| 5,218,709 A | 6/1993 | Fijany et al. |
| 5,241,296 A | 8/1993 | Naka et al. |
| 5,268,834 A | 12/1993 | Sanner et al. |
| 5,321,829 A | 6/1994 | Zifferer |
| 5,347,446 A | 9/1994 | Iino et al. |
| 5,347,466 A | 9/1994 | Nichols et al. |
| 5,361,198 A | 11/1994 | Harmon et al. |
| 5,428,555 A | 6/1995 | Starkey et al. |
| 5,485,600 A | 1/1996 | Joseph et al. |
| 5,485,620 A | 1/1996 | Sadre et al. |
| 5,491,625 A | 2/1996 | Pressnall et al. |
| 5,509,116 A | 4/1996 | Hiraga et al. |
| 5,530,643 A | 6/1996 | Hodorowski |
| 5,546,301 A | 8/1996 | Agrawal et al. |
| 5,555,385 A | 9/1996 | Osisek |
| 5,576,946 A | 11/1996 | Bender et al. |
| 5,594,858 A | 1/1997 | Blevins |
| 5,603,018 A | 2/1997 | Terada et al. |
| 5,611,059 A | 3/1997 | Benton et al. |
| 5,631,825 A | 5/1997 | van Weele et al. |
| 5,732,192 A | 3/1998 | Malin et al. |
| 5,752,008 A | 5/1998 | Bowling |
| 5,768,119 A | 6/1998 | Havekost et al. |
| 5,796,602 A | 8/1998 | Wellan et al. |
| 5,801,942 A | 9/1998 | Nixon et al. |
| 5,806,053 A | 9/1998 | Tresp et al. |
| 5,812,394 A | 9/1998 | Lewis et al. |
| 5,818,736 A | 10/1998 | Leibold |
| 5,821,934 A | 10/1998 | Kodosky et al. |
| 5,826,060 A | 10/1998 | Santoline et al. |
| 5,828,851 A | 10/1998 | Nixon et al. |
| 5,838,561 A | 11/1998 | Owen |
| 5,838,563 A | 11/1998 | Dove et al. |
| 5,862,052 A | 1/1999 | Nixon et al. |
| 5,889,530 A | 3/1999 | Findlay |
| 5,892,939 A | 4/1999 | Call et al. |
| 5,898,860 A | 4/1999 | Leibold |
| 5,903,455 A | 5/1999 | Sharpe, Jr. et al. |
| 5,909,916 A | 6/1999 | Foster et al. |
| 5,940,294 A | 8/1999 | Dove |
| 5,950,006 A | 9/1999 | Crater et al. |
| 5,960,214 A | 9/1999 | Sharpe, Jr. et al. |
| 5,970,430 A | 10/1999 | Burns et al. |
| 5,980,078 A | 11/1999 | Krivoshein et al. |
| 5,983,016 A | 11/1999 | Brodsky et al. |
| 5,995,753 A | 11/1999 | Walker |
| 5,995,916 A | 11/1999 | Nixon et al. |
| 6,003,037 A | 12/1999 | Kassabgi et al. |
| 6,023,644 A | 2/2000 | Kinsman |
| 6,032,208 A | 2/2000 | Nixon et al. |
| 6,041,171 A | 3/2000 | Blaisdell et al. |
| 6,069,629 A | 5/2000 | Paterson et al. |
| 6,078,320 A | 6/2000 | Dove et al. |
| 6,094,600 A | 7/2000 | Sharpe, Jr. et al. |
| 6,098,116 A | 8/2000 | Nixon et al. |
| 6,138,174 A | 10/2000 | Keeley |
| 6,146,143 A | 11/2000 | Huston et al. |
| 6,157,864 A | 12/2000 | Schwenke et al. |
| 6,161,051 A | 12/2000 | Hafemann et al. |
| 6,167,316 A | 12/2000 | Gloudeman et al. |
| 6,173,438 B1 | 1/2001 | Kodosky et al. |
| 6,178,393 B1 | 1/2001 | Irvin |
| 6,195,591 B1 | 2/2001 | Nixon et al. |
| 6,201,996 B1 | 3/2001 | Crater et al. |
| 6,298,454 B1 | 10/2001 | Schleiss et al. |
| 6,366,272 B1 | 4/2002 | Rosenberg et al. |
| 6,385,496 B1 | 5/2002 | Irwin et al. |
| 6,415,418 B1 | 7/2002 | McLaughlin et al. |
| 6,442,512 B1 | 8/2002 | Sengupta et al. |
| 6,442,515 B1 | 8/2002 | Varma et al. |
| 6,445,963 B1 | 9/2002 | Blevins et al. |
| 6,449,624 B1 | 9/2002 | Hammack et al. |
| 6,477,435 B1 | 11/2002 | Ryan et al. |
| 6,505,519 B2 | 1/2003 | Henry et al. |
| 6,510,351 B1 | 1/2003 | Blevins et al. |
| 6,515,683 B1 | 2/2003 | Wright |
| 6,522,934 B1 | 2/2003 | Irwin et al. |
| 6,546,297 B1 | 4/2003 | Gaston et al. |
| 6,577,908 B1 | 6/2003 | Wojsznis et al. |
| 6,587,108 B1 | 7/2003 | Guerlain et al. |
| 6,615,090 B1 | 9/2003 | Blevins et al. |
| 6,618,630 B1 | 9/2003 | Jundt et al. |
| 6,618,745 B2 | 9/2003 | Christensen et al. |
| 6,633,782 B1 | 10/2003 | Schleiss et al. |
| 6,647,315 B1 | 11/2003 | Sherriff et al. |
| 6,684,385 B1 | 1/2004 | Bailey et al. |
| 6,687,698 B1 | 2/2004 | Nixon et al. |
| 6,704,737 B1 | 3/2004 | Nixon et al. |
| 6,711,629 B1 | 3/2004 | Christensen et al. |
| 6,754,885 B1 | 6/2004 | Dardinski et al. |
| 6,795,798 B2 | 9/2004 | Eryurek et al. |
| 6,804,636 B2 | 10/2004 | Senta et al. |
| 6,957,110 B2 * | 10/2005 | Wewalaarachchi .... G05B 15/02 |
| | | 700/17 |
| 6,981,424 B2 | 1/2006 | Henry et al. |
| 7,050,083 B2 | 5/2006 | Yoo et al. |
| 7,050,863 B2 | 5/2006 | Mehta et al. |
| 7,065,476 B2 | 6/2006 | Dessureault et al. |
| 7,076,740 B2 | 7/2006 | Santori et al. |
| 7,089,530 B1 | 8/2006 | Dardinski et al. |
| 7,096,465 B1 | 8/2006 | Dardinski et al. |
| 7,110,835 B2 | 9/2006 | Blevins et al. |
| 7,113,834 B2 | 9/2006 | Wojsznis et al. |
| 7,146,231 B2 | 12/2006 | Schleiss et al. |
| 7,219,306 B2 | 5/2007 | Kodosky et al. |
| 7,266,476 B2 | 9/2007 | Coburn et al. |
| 7,272,454 B2 | 9/2007 | Wojsznis et al. |
| 7,275,235 B2 * | 9/2007 | Molinari ............ G01R 13/345 |
| | | 717/100 |
| 7,317,959 B2 | 1/2008 | Pfander et al. |
| 7,395,122 B2 | 7/2008 | Kreidler et al. |
| 7,502,656 B2 | 3/2009 | Thibault et al. |
| 7,555,471 B2 | 6/2009 | Hogue et al. |
| 7,557,702 B2 | 7/2009 | Eryurek et al. |
| 7,565,215 B2 | 7/2009 | Kolenc et al. |
| 7,593,780 B2 | 9/2009 | Mann et al. |
| 7,627,860 B2 * | 12/2009 | Kodosky ............ G05B 19/0426 |
| | | 715/763 |
| 7,647,126 B2 | 1/2010 | Blevins et al. |
| 7,743,362 B2 | 6/2010 | Peck et al. |
| 7,836,426 B2 | 11/2010 | Peck et al. |
| 7,865,349 B2 | 1/2011 | Kodosky et al. |
| 7,881,816 B2 | 2/2011 | Mathiesen et al. |
| 8,055,738 B2 * | 11/2011 | Shah ................. G06F 9/44505 |
| | | 709/220 |
| 8,135,481 B2 * | 3/2012 | Blevins ................. G05B 17/02 |
| | | 700/51 |
| 8,136,088 B2 | 3/2012 | Makowski et al. |
| 8,825,183 B2 * | 9/2014 | Hammack ............ G05B 19/409 |
| | | 700/17 |
| 8,881,039 B2 * | 11/2014 | Hammack ............ G06T 3/0012 |
| | | 715/764 |
| 9,046,881 B2 | 6/2015 | Blevins et al. |
| 2001/0039462 A1 | 11/2001 | Mendez et al. |
| 2002/0111783 A1 | 8/2002 | Kodosky et al. |
| 2002/0198668 A1 * | 12/2002 | Lull ................... G01F 25/0007 |
| | | 702/45 |

(56) References Cited

U.S. PATENT DOCUMENTS

| | | |
|---|---|---|
| 2003/0188830 A1 | 10/2003 | Narendrnath et al. |
| 2003/0200062 A1 | 10/2003 | Dessureault et al. |
| 2004/0032433 A1 | 2/2004 | Kodosky et al. |
| 2004/0078182 A1 | 4/2004 | Nixon et al. |
| 2004/0249483 A1 | 12/2004 | Wojsznis et al. |
| 2005/0062677 A1 | 3/2005 | Nixon et al. |
| 2005/0096872 A1 | 5/2005 | Blevins et al. |
| 2005/0158701 A1 | 7/2005 | West |
| 2005/0164684 A1 | 7/2005 | Chen et al. |
| 2005/0187717 A1 | 8/2005 | Paxson et al. |
| 2005/0197786 A1 | 9/2005 | Kataria et al. |
| 2005/0257195 A1 | 11/2005 | Morrow et al. |
| 2006/0073013 A1 | 4/2006 | Emigholz et al. |
| 2006/0106477 A1 | 5/2006 | Miyashita |
| 2006/0259163 A1 | 11/2006 | Hsiung et al. |
| 2007/0059838 A1 | 3/2007 | Morrison et al. |
| 2007/0078529 A1 | 4/2007 | Thiele et al. |
| 2007/0129917 A1 | 6/2007 | Blevins et al. |
| 2007/0132779 A1* | 6/2007 | Gilbert .................. G06F 9/4488 345/619 |
| 2007/0156264 A1 | 7/2007 | Schleiss et al. |
| 2008/0027704 A1 | 1/2008 | Kephart et al. |
| 2008/0288089 A1 | 11/2008 | Pettus et al. |
| 2009/0210814 A1 | 8/2009 | Agrusa et al. |
| 2009/0222752 A1 | 9/2009 | Wall et al. |
| 2009/0287321 A1 | 11/2009 | Lucas et al. |
| 2009/0292514 A1* | 11/2009 | McKim .................. G09B 9/00 703/6 |
| 2010/0251255 A1* | 9/2010 | Miyamoto et al. ... G06F 9/4856 718/104 |
| 2011/0040390 A1* | 2/2011 | Blevins .............. G05B 19/0426 700/18 |
| 2011/0071651 A1* | 3/2011 | Law .................. G05B 19/0426 700/11 |
| 2011/0191500 A1* | 8/2011 | Odayappan ........ G05B 19/0426 710/8 |
| 2012/0179276 A1* | 7/2012 | Kolenc .................. G06Q 10/06 700/79 |
| 2012/0253479 A1* | 10/2012 | Radl .................... G05B 19/042 700/12 |
| 2012/0290107 A1* | 11/2012 | Carlson ................ G05B 19/058 700/83 |
| 2013/0073062 A1* | 3/2013 | Smith .................... G06Q 10/04 700/33 |
| 2013/0191106 A1* | 7/2013 | Kephart ................ G05B 17/02 703/21 |
| 2014/0039656 A1* | 2/2014 | Humped ............ G05B 19/0426 700/97 |
| 2014/0047417 A1* | 2/2014 | Kaasila ................ G06F 11/3664 717/135 |
| 2014/0163724 A1* | 6/2014 | Drebinger .............. B65G 53/66 700/230 |
| 2014/0257526 A1* | 9/2014 | Tiwari .................... G05B 13/02 700/29 |
| 2015/0106066 A1* | 4/2015 | Boys .................. G06F 17/5009 703/2 |
| 2015/0106067 A1* | 4/2015 | Boys .................. G06F 17/5009 703/2 |
| 2015/0106068 A1* | 4/2015 | Boys ...................... G05B 17/02 703/2 |
| 2015/0106073 A1* | 4/2015 | Boys .................. G06F 17/5009 703/6 |
| 2015/0106075 A1* | 4/2015 | Boys ...................... G05B 17/02 703/9 |
| 2015/0178422 A1 | 6/2015 | McKim et al. |
| 2015/0261200 A1 | 9/2015 | Blevins et al. |
| 2016/0033952 A1* | 2/2016 | Schroeter ......... G05B 19/41885 700/108 |
| 2016/0132538 A1* | 5/2016 | Bliss ............... G05B 19/41855 707/741 |
| 2016/0132595 A1* | 5/2016 | Bliss ................. G06F 17/30864 707/706 |
| 2016/0313751 A1* | 10/2016 | Risbeck ............. G05D 23/1917 |
| 2016/0313752 A1* | 10/2016 | Przybylski ......... G05D 23/1917 |
| 2017/0371984 A1* | 12/2017 | Eliseeva ................ E21B 43/00 |
| 2018/0032651 A1* | 2/2018 | Snyder ................ G06F 17/5004 |

FOREIGN PATENT DOCUMENTS

| | | |
|---|---|---|
| DE | 197 81 804 | 5/1999 |
| DE | 100 11 661 B4 | 9/2011 |
| EP | 0 813 129 A2 | 12/1997 |
| EP | 0 875 826 A1 | 11/1998 |
| EP | 1 204 033 | 5/2002 |
| EP | 1 284 446 | 2/2003 |
| GB | 2 328 523 | 2/1999 |
| GB | 2 348 020 | 9/2000 |
| GB | 2 371 884 | 8/2002 |
| GB | 2 446 343 A | 8/2008 |
| JP | 1-298389 | 12/1979 |
| JP | 60-75909 A | 4/1985 |
| JP | 1-120593 | 5/1989 |
| JP | 2-310602 | 12/1990 |
| JP | 03-257509 A | 11/1991 |
| JP | 5-54277 | 3/1993 |
| JP | 6-26093 | 2/1994 |
| JP | 7-036538 | 2/1995 |
| JP | 7-248941 | 9/1995 |
| JP | 8-314760 | 11/1996 |
| JP | 9-134213 A | 5/1997 |
| JP | 9-330013 | 12/1997 |
| JP | 11-007315 A | 1/1999 |
| JP | 2000-047860 | 2/2000 |
| JP | 2000-050531 | 2/2000 |
| JP | 2000-148226 A | 5/2000 |
| JP | 2000-242323 A | 9/2000 |
| JP | 2000-243323 A | 9/2000 |
| JP | 2000-266213 A | 9/2000 |
| JP | 2000-292584 A | 10/2000 |
| JP | 2000-311004 | 11/2000 |
| JP | 2000-346299 A | 12/2000 |
| JP | 2001-273006 A | 10/2001 |
| JP | 2002-140114 | 5/2002 |
| JP | 2002-189503 A | 7/2002 |
| JP | 2002-215221 A | 7/2002 |
| JP | 2002-258936 | 9/2002 |
| JP | 2002-303564 | 10/2002 |
| JP | 2004-199656 A | 7/2004 |
| JP | 2003-34629 A | 9/2004 |
| JP | 2006-244072 A | 9/2006 |
| JP | 9-288512 | 11/2007 |
| JP | 2013200670 A | 10/2013 |
| WO | WO-97/38362 | 10/1997 |
| WO | WO-97/45778 | 12/1997 |
| WO | WO-2007/067645 | 6/2007 |

OTHER PUBLICATIONS

Rainer Drath et al., "Computer-aided design and implementation of interlock control code", Proceedings of the 2006 IEEE Conference on Computer Aided Control Systems Design, Munich, Germany, Oct. 4-6, 2006, pp. 2653-2658. (Year: 2006).*

Mario Hoernicke et. al., System and Method for a Human Machine Interface based Automatic Generation of Process Simulation Models, An IP.com Prior Art Database Technical Disclosure, Nov. 14, 2011, pp. 1-10; (Year: 2011).*

"Powerful Solutions for Digital Plants", Mimic Simulation v2.6, Mynah Technologies 2003, pp. 1-15.

Alsop et al., "What Dynamic Simulation Brings to a Process Control Engineer: Applied Case Study to a Propylene/Propane Splitter," <URL:http://www.aspentech.com/publication_files/ertc2004_alsop_ferrer.pdf> (May 2004).

Bailey, "Introducing Bailey Evolution 9Q™... The Sound Investment Strategy for Process Automation", 1993.

Bailey, "Wide-Range, Fully Compatible Family of Process Automation and Management Systems", 1993.

Chinese Office Action for Application No. 2003101027291, dated Jun. 21, 2007.

Chinese Office Action for Application No. 2003101027291, dated Nov. 19, 2010.

(56) References Cited

OTHER PUBLICATIONS

Chinese Rejection Decision for Application No. 2003101027291, dated Feb. 5, 2010.
Combined Search and Examination Report for Application No. GB 0514164.3, dated Dec. 23, 2005.
Computer Products, "Unbundling the DCS", approximately 1992.
Decision of Rejection for Japanese Application No. 2012-183410 dated Apr. 22, 2014.
Elsag Bailey, "Elsag Bailey Automation", approximately 1993.
Examination Report for Application No. GB0719214.9, dated Oct. 11, 2010.
Examination Report for Application No. GB0719214.9, dated Sep. 9, 2009.
Fisher-Rosemount, "Managing the Process Better", Dec. 1993.
Fisher-Rosemount, "Managing the Process Better", Sep. 1993.
German Office Action for Application No. 103 48 564.3, dated Jul. 16, 2012.
German Office Action for Application No. 10348563.5-55, Mar. 28, 2011.
Honeywell, "Process Manager Specification and Technical Data", Sep. 1991.
Honeywell, "TDC 3000 Overview", approximately 1992.
Honeywell, "TDC 3000 Process Manager", approximately 1992.
Honeywell, "UDC 6000 Process Controller," Aug. 1992.
Invensys Process Systems News, Invensys Introduces Enhanced Foxboro Engineering and Operations for the I/A Series Automation System, (2002): Retreived from the Internet on May 28, 2010: <URL:http://www.automation.com/smc/print.php?stripImages-no>.
Japanese Office Action for 2010-108486 dated Mar. 6, 2012.
Japanese Office Action for Application No. 2003-358631, dated Sep. 4, 2007.
Leeds and Northrup, "Make Your Automation Plan a Reality: MAX 1000", approximately 1990.
Magin, "Digitale Prozessleittechnik," 1st Edition, Vogel Publishing, pp. 145-153 (1987).
Nahavandi et al., "A Virtual Manufacturing Environment with an Element of Reality," *Advanced Factory Automation, Conf.* Pub. 398: 624-629 (1994).
Notice of Reasons for Rejection for Japanese Application No. 2007-258407 dated May 22, 2012.
Notice of Reasons for Rejection for Japanese Application No. 2010-108486, dated Jan. 7, 2013.
Notice of Reasons for Rejection for Japanese Application No. 2011-27092, dated Nov. 13, 2012.
Notice of Reasons for Rejection for Japanese Application No. 2011-274307, dated Feb. 5, 2013.
Notice of Reasons for Rejection for Japanese Application No. 2012-183410, dated Jul. 23, 2013.
Notice of Reasons for Rejection for Japanese Application No. 2012-195268, dated Aug. 13, 2013.
Notice of Rejection for Japanese Application No. 2000-134873, dated Feb. 3, 2004.
Notice of Rejection for Japanese Application No. 2003-358631, dated Jan. 16, 2007.
Notice of Rejection for Japanese Application No. 2003-358631, dated Sep. 4, 2007.
Notice of Rejection for Japanese Application No. 2003-362187, dated Nov. 2, 2009.
Notice of Rejection for Japanese Application No. 2003-362187, dated Sep. 6, 2010.
Office Action for U.S. Appl. No. 11/537,975, dated Jul. 8, 2009.
Ohmura, "Dynamic Simulator Visual Modeler," pp. 20-27 (1998).
Podesta et al., "Virtual Instrumentation for the Management, Simulation and Control of an in House Power Plant," IEEE Instrumentation and Measurement Technology Conference, pp. 1104-1106 (1996).
PSS 21S-2B8 B4, FoxView Software, pp. 1-12 (2005).
Questioning for Japanese Patent Application No. 2003-362187 issued Feb. 14, 2012.
Reliance Electric Company, "Multitasking Capability Simplifies Process Control Design", approximately late 1980s, by Angelo J. Notte.
Search Report for Application No. GB0719214.9, dated Feb. 12, 2008.
Search Report for Application No. GB 0010850.6, dated Sep. 5, 2000.
Search Report for Application No. GB 0324470.4, dated Mar. 25, 2004.
Search Report for Application No. GB 0324633.7, dated Mar. 30, 2004.
Second Office Action for Chinese Application No. 200710164172.2, dated Jun. 5, 2012.
Toshiba, "Toshiba Integrated Control Systems", Nov. 1990.
UPID Brochure, Cutler Technology Corporation, <URL:http://www.culter-tech.com> (2010).
Yumoto, "Evolving Dynamic Simulator: Visual Modeler," *Separation Technology*, 6(6):367-372 (1999).
National Instruments, "What is Data Acquisition," pp. 1-2 (2014).
Wikipedia, "SCADA," (2014).
SCADA, Wikipedia, printed Aug. 11, 2014, pp. 1.
National Instruments, "What Is Data Acquisition", printed Aug. 11, 2014, pp. 1-2.
Combined Search and Examination Report for Application No. GB 0514161.9, dated Jan. 10, 2006.
Examination Report for Application No. GB0719214.9, dated Mar. 4, 2010.
Examination Report for Application No. GB0719214.9, dated Aug. 10, 2010.
Office Action issued in Chinese Application No. 201310529560.1, dated Aug. 27, 2015.
IEEE 100 the Authoritative Dictionary of IEEE Standards Terms, 2000, Seventh Edition, p. 1054.
Second Office Action issue in Chinese Application No. 201310529560.1, dated Apr. 13, 2016.
Third Office Action issued in Chinese Application No. 201310529560.1, dated Sep. 2, 2016.
U.S. Appl. No. 14/725,662, filed May 29, 2015.
Non-Final Office Action received in U.S. Appl. No. 14/425,662, dated Jul. 13, 2015.
Non-Final Office Action received in U.S. Appl. No. 14/425,662, dated Feb. 22, 2016.
Final Office Action received in U.S. Appl. No. 14/425,662, dated May 26, 2016.
Final Office Action received in U.S. Appl. No. 14/425,662, dated Oct. 18, 2016.
Search Report for Application No. GB1711105.5, dated Jan. 4, 2018.
Office Action issued in Philippine Patent Application No. 1/2017/00019 dated Jan. 8, 2018.
Examination Report issued in Philippine Patent Application No. 1/2017/000197 dated Jun. 30, 2020.

\* cited by examiner

PLANT BUILDER SYSTEM WITH INTEGRATED SIMULATION AND CONTROL SYSTEM CONFIGURATION

TECHNICAL FIELD

The present disclosure relates generally to designing plants and control systems for the plants.

BACKGROUND

To design a control scheme for a controlled process, a control engineer needs information regarding the physical layout of the plant, the actuators used to manipulate the controlled process, and the sensors used to measure various aspects of the process. Typically, much of this needed information can be derived from a process and instrumentation diagram (P&ID), sometimes referred to as a piping and instrumentation diagram.

A P&ID is a diagram showing relationships between equipment used at a plant. This equipment may include (i) actuators and other process equipment facilitating the manipulation of product and/or product flow (e.g., tanks, pipes, pumps, valves, fans, dryers, cooling towers, heat exchangers, etc.); (ii) instruments that obtain measurements of various aspects of the process (e.g., sensors to measure temperature, flow, pressure, fluid levels, etc.); (iii) control system equipment that calculates how the actuators should be manipulated to achieve desired process outputs (e.g., based on measurements obtained from the instruments/sensors); and/or (iv) communication equipment that facilitates communication between the actuators, instruments/sensors, and control system equipment.

Typically, P&IDs are utilized to design a plant, functioning as a sort of blueprint or roadmap for the layout of the physical components in the plant. For example, an engineer may utilize a computer-aided drafting tool to design P&IDs for multiple areas of a plant. Once the P&IDs are finalized, the plant (or a portion of the plant) is constructed by installing process equipment (e.g., piping, tanks, valves, etc.) and instruments (e.g., sensors) according to the design depicted by the P&IDs.

Once the process equipment and instrumentation has been installed, communication schemes may be designed and control system components may be installed to communicate with the actuators (e.g., valves, pumps, and other motors) and sensors (e.g., temperature sensors, flow sensors, etc.) installed in the plant. While setting up the communication scheme for the plant, an engineer may manually upload to the control system instrument identifiers (or "tags") uniquely associated with the installed actuators and sensors. These tags can then be referenced by the control system components to control the actuators and receive measurements from the sensors. The engineer will typically reference the P&ID when performing this control system configuration to ensure that the control system (i) relies on the measurements or feedback from the appropriate devices, and (ii) transmits control signals to control the appropriate devices. Once the control system is configured, a control engineer may design control schemes for controlling the plant, referencing the P&ID to understand the physical layout of the components in the plant.

Unfortunately, this plant design procedure is redundant, time consuming, tedious, and error-prone. In some instances, for example, a plant may be constructed according to a flawed design, as depicted by the P&IDs. Due to the expense involved in buying and installing the complex equipment installed at process plants, redesigning the plant is typically not an option.

SUMMARY

The described methods and systems enable iterative plant design. These methods and systems may be utilized to test multiple P&ID designs and control strategies before a plant is constructed, enabling engineers to test physical layouts and control strategies before the plant is constructed. In short, the described methods and systems facilitate design of optimal physical layouts and optimal control strategies.

In an embodiment, a plant builder system may comprise a display, a processor communicatively coupled to the display, and a memory communicatively coupled to the processor. The memory may store (A) a P&ID routine that when executed causes the display to display a configuration area to facilitate design by a user of a process and instrumentation diagram (P&ID) for a part of a plant based on a user's placement in the displayed configuration area of a plurality of equipment symbols; and (B) an equipment object generator routine that when executed generates a plurality of executable equipment objects based on the plurality of equipment symbols in the P&ID, wherein an equipment object from the plurality of equipment objects corresponds to a particular equipment symbol from the plurality of equipment symbols in the P&ID. Each of the equipment objects may include (i) a name element defined according to a name from the P&ID that is associated with the particular equipment symbol; (ii) a graphic element defined according to the particular equipment symbol; (iii) a material input/output ("I/O") element defined according to one or more of the plurality of connection symbols connected to the particular equipment symbol in the P&ID, the material I/O element defining material inputs and outputs for a physical equipment component corresponding to the particular equipment symbol; (iv) a simulation element that can be defined via user input to specify simulation behavior for the equipment object; and/or (v) an undefined communication I/O element that can be defined to specify an address that can be utilized by a controller to communicate with the physical equipment component.

In an embodiment, a method may comprise presenting a configuration area at a display to facilitate design by a user of a process and instrumentation diagram (P&ID) based on the user's placement in the displayed configuration area of a plurality of equipment symbols. The method may comprise generating an executable equipment object corresponding to a physical equipment component represented by a particular equipment symbol from the plurality of equipment symbols in the P&ID. The generated equipment object may include (i) a name element defined according to a name from the P&ID that is associated with the particular equipment symbol; (ii) a graphic element defined according to the particular equipment symbol; (iii) a material input/output ("I/O") element defined according to one or more of the plurality of connection symbols connected to the particular equipment symbol in the P&ID, the material I/O element defining material inputs and outputs for a physical equipment component corresponding to the particular equipment symbol; (iv) a simulation element that can be defined via user input to specify simulation behavior for the equipment object; and/or (v) an undefined communication I/O element that can be defined to enable a controller to communicate with the physical equipment component.

In an embodiment, a plant builder system may comprise a means for presenting a configuration area at a display to facilitate design by a user of a process and instrumentation diagram (P&ID) based on the user's placement in the displayed configuration area of a plurality of equipment symbols. The plant builder system may comprise a means for generating an equipment object corresponding to a physical equipment component represented by a particular equipment symbol from the plurality of equipment symbols in the P&ID. The generated equipment object may include (i) a name element defined according to a name from the P&ID that is associated with the particular equipment symbol; (ii) a graphic element defined according to the particular equipment symbol; (iii) a material input/output ("I/O") element defined according to one or more of the plurality of connection symbols connected to the particular equipment symbol in the P&ID, the material I/O element defining material inputs and outputs for a physical equipment component corresponding to the particular equipment symbol; (iv) a simulation element that can be defined via user input to specify simulation behavior for the equipment object; and/or (v) an undefined communication I/O element that can be defined to enable a controller to communicate with the physical equipment component.

BRIEF DESCRIPTION OF THE DRAWINGS

Each of the figures described below depicts one or more aspects of the disclosed system(s) and/or method(s), according to an embodiment. Wherever possible, the following description refers to the reference numerals included in the following figures.

DETAILED DESCRIPTION

Figure 1A:
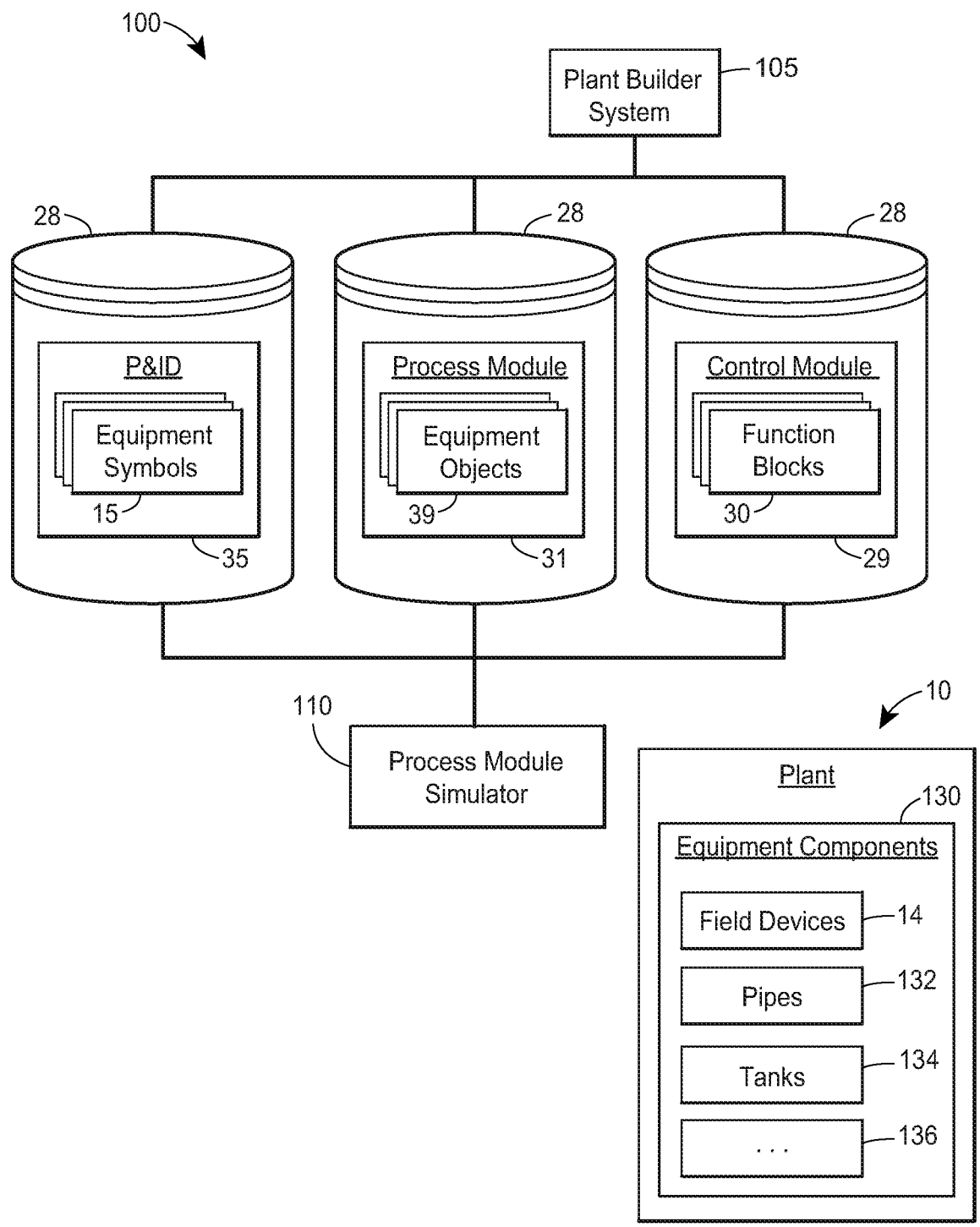
FIG. 1A is a relational diagram for a system including a plant builder system according to an embodiment.

Various techniques, systems, and methods are discussed below with reference to FIGS. 1-7. The description below is divided into the following sections:
I. Overview
II. The Plant
III. A Prior Art Method for Plant Design
IV. Designing a Plant According to the Disclosed Embodiments
V. Additional Considerations I. Overview FIG. 1A is a relational diagram for a system 100 including a plant builder system 105 according to an embodiment. The system 100 includes the plant builder system 105, one or more databases 28, and/or a process module simulator 110. The one or more databases 28 may include piping and instrumentation diagrams (P&IDs) 35, sometimes referred to as a process and instrumentation diagrams 35; process modules 31; and/or control modules 29.

Generally speaking, the plant builder system 105 (sometimes referred to as the plant builder 105) is a computer or group of computers configured to facilitate various stages of design and redesign for a plant 10. The plant builder 105 may be used to design a whole plant 10 or a part of a plant 10, which may include various equipment components 130. For example, the plant builder 105 may be useful for designing an expansion to an existing plant.

The plant 10 is a plant used for controlling any type of process. For example, the plant 10 may be a power plant, a chemical processing plant, an oil refinery, or any other process plant. The plant 10 may include various equipment components 130, such as field devices 14, pipes 132 for moving material, tanks 134 for holding material, and other equipment components 136. To produce a final product (e.g., electricity, refined oil, ethanol, etc.), a control system is utilized to monitor and control the process. This monitoring and control is accomplished by way of the field devices 14, which typically include sensors for measuring various aspects of the process and/or actuators for manipulating various aspects of the process. These field devices 14 are typically communicatively connected to controllers (not shown) installed at the plant 10 that are responsible for controlling and/or monitoring various aspects of the process. Field devices 14 are described in more detail with reference to FIG. 1B. The particular arrangement of the various equipment 130 in the plant 10 is designed to achieve a specific goal. Thus, careful thought should go into the design of the plant 10 before it is constructed. The plant 10 is described in more detail with reference to FIG. 1B.

The plant builder system 105 facilitates improved plant design. Notably, the plant builder 105 enables the creation and use of three different types of entities: the P&IDs 35, the equipment objects 39, and the control modules 29. These entities may be created and utilized in an integrated manner to provide enhanced plant design, plant simulation, and plant control. The P&IDs 35, equipment objects 39, and control modules 29 may be stored at any suitable data store 28, and may be stored together or independently.

A. P&IDs 35

The P&IDs 35 are diagrams showing relationships between equipment used in the plant 10. Each P&ID 35 comprises symbols 15 representing particular pieces of equipment 130 that are installed, or planned for potential installation, in the plant 10. Generally speaking, a P&ID 35 can be thought of as a blueprint or roadmap for a particular area or unit of the plant 10. For example, a P&ID 35 may depict a water cooling area for the plant 10, and may include symbols 15 corresponding to the particular tanks 134, pipes 132, field devices 14, and other equipment 136 to be included in the water cooling area. The P&IDs 35 are designed and generated at the plant builder 105, and may be displayed via a display at the plant builder 105.

B. Equipment Objects 39

Each equipment object 39 represents a particular equipment component 130 installed (or planned for potential installation) in the plant 10, and generally to a symbol 15 in a P&ID 35. The equipment objects 39 are modules, routines, and/or data structures that may be referenced and utilized by various devices within the plant 10 for plant design, simulation, and control. For each object 39, these data structures may include attributes for the object 39 and for the equipment component 130 corresponding to the object 39.

Figure 5:
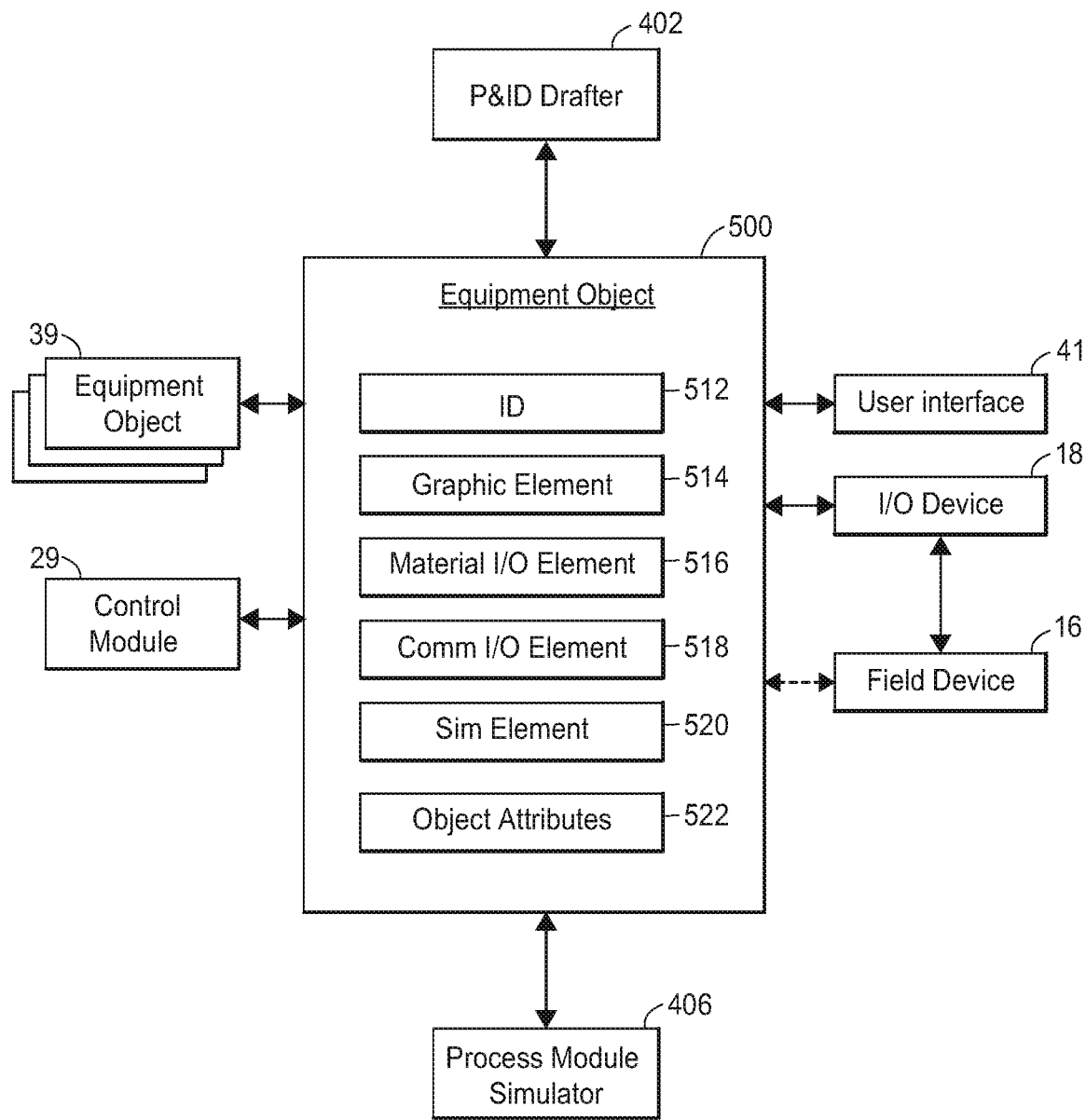
FIG. 5 is a block diagram of an example equipment object that may be generated by a plant builder according to an embodiment.
Figure 6:
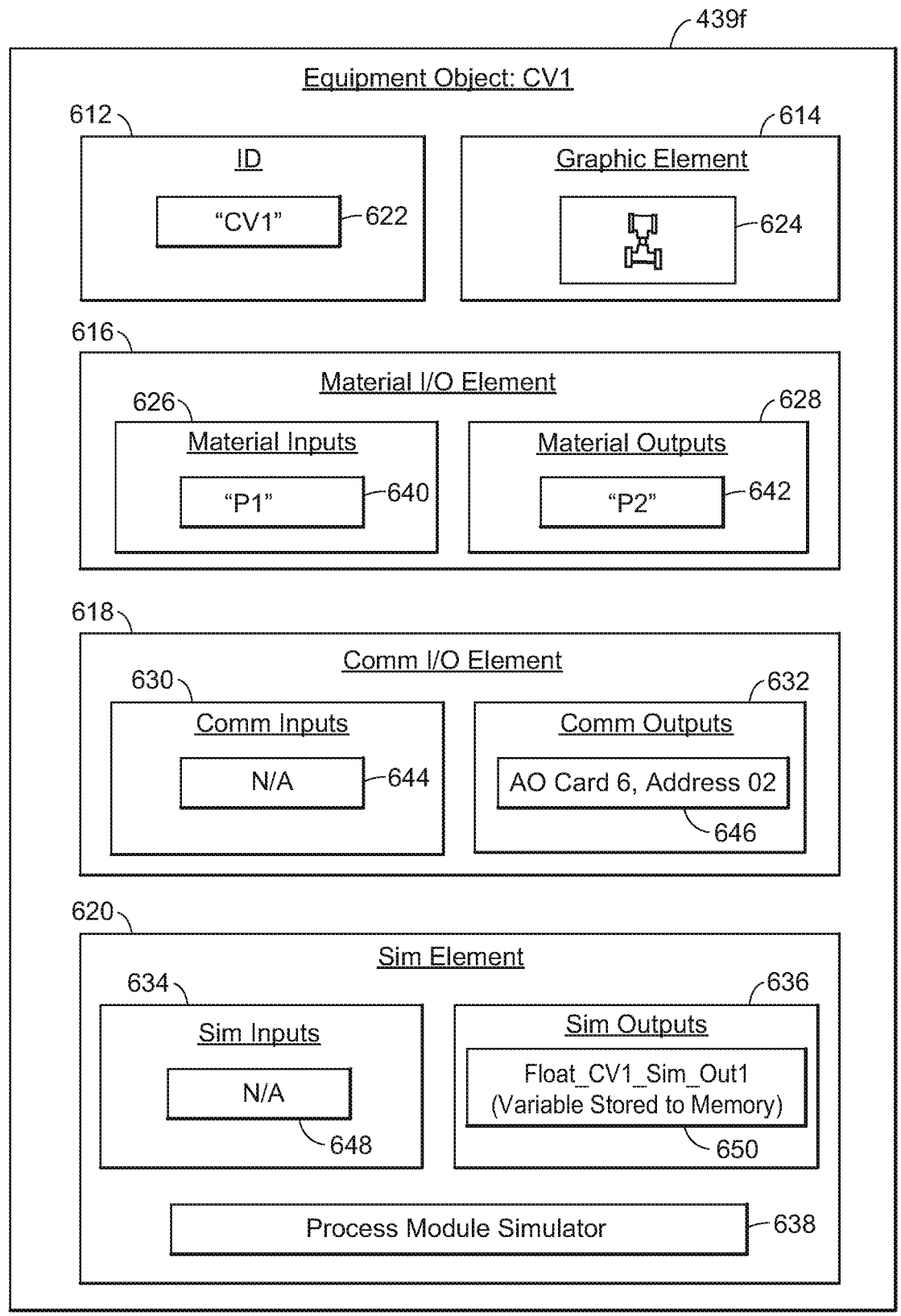
FIG. 6 is a block diagram of an example equipment object that may be generated by a plant builder according to an embodiment.

For example, each equipment object 39 may include or reference: a particular identifier ("ID") unique to the equipment component; a graphic element for the equipment component (for display on the P&ID and/or operator display); a material I/O element identifying other equipment objects the equipment object is linked to (and thus identifying other equipment components the underlying equipment component is connected to); a communication I/O element identifying a means (e.g., an I/O device address) for communicating with the underlying equipment component; simulation functionality for simulating the underlying equipment component; and/or device/equipment parameters corresponding to the represented equipment component 130 (e.g., a diameter or Reynolds number for a pipe). Example equipment objects are shown in FIGS. 5 and 6.

One or more of the equipment objects 39 may be organized as a collection or unit referred to as a process module 31. Generally speaking, each process module 31 corresponds to a particular area or unit depicted in one of the P&IDs 35, and may be used to simulate operation of that particular area or unit.

Each equipment object 39 may have multiple operation modes, such as "simulation mode" and "normal mode." During normal mode or normal operation, an equipment object 39 may be referenced or otherwise utilized by the control system to communicate with corresponding equipment components 130. For example, in normal operation, equipment objects 39 may: (i) forward control signals received from a control module 29 executing at a controller to an underlying field device 14 including an actuator (such as a pump or valve), and/or (ii) forward measurements received from an underlying field device 14 including a sensor (e.g., from a flow sensor or level sensor) to the appropriate control module 29. When in simulation mode, the equipment objects 39 may forward control signals received from a control module 30 to the process module simulator 110, and may forward simulated measurements received from the simulator 110 (which may be simulating operation of the corresponding equipment component, such as a sensor) to the appropriate control module 29.

The simulator 110 may be any computing device or system executing a simulation routine or routines configured to simulate operation of the equipment components 130 represented by the equipment objects 39 in the process module 31.

In some embodiments, the simulator 110 and the plant builder system 105 are distinct devices or platforms. In other embodiments, the simulator 110 and the plant builder system 105 are the same system or device. In some instances, the simulation routine may be an application, routine, or subroutine that is part of a larger suite of applications making up the plant builder system 105.

In operation, the simulator 110 analyzes a simulated status of each of the equipment objects 39 and executes logic designed to simulate operation of the equipment components 130 according to the simulated status of the equipment objects 39 (e.g., according to the simulated measurements and inputs of the underlying equipment components 130). For example, when a simulated valve on a hot water line entering a tank is opened, the following downstream objects may be affected: a flow sensor on the hot water line; a temperature sensor for the liquid in the tank; and a level sensor for the liquid in the tank. The simulator 110 may simulate measurements for each of these sensors in response to the simulated valve opening. Depending on the embodiment, the simulator 110 may simulate operation of equipment represented by multiple process modules 31 by referencing the P&ID(s) 35 to determine relationships between the various process modules 31.

C. Control Modules 29

A "control module" is a set of instructions, executable by a processor (e.g., of a controller), for performing one or more operations to provide or perform on-line control of at least part of a process. The control modules 29 may be saved to memory, e.g., as one or more routines, applications, software modules, or programs. The control modules 29 may include any type of control module. The control modules 29 may reference the equipment objects 39 to communicate with field devices 14 corresponding to the equipment objects 39.

Each of the control modules 29 can be made up of function blocks 30, wherein each function block 30 is a part or a subroutine of an overall control routine (e.g., embodied by one of the control modules 29). Function blocks 30, which may be objects in an object oriented programming protocol, typically perform one of: (i) an input function, such as receiving an analog or discrete input signal associated with a transmitter, sensor, or other process parameter measurement device; (ii) a control function, such as that associated with a control routine that performs PID, fuzzy logic, etc. control; or (iii) an output function, such as causing a controller to transmit an analog or discrete output signal to control operation of some actuator or device (such as a valve) to perform some physical function (e.g., opening or closing the valve) within the process plant 10. Of course hybrid and other types of complex function blocks exist such as model predictive controllers (MPCs), optimizers, etc.

Each control module 29 may operate in conjunction with other control modules 29 and function blocks 30 (via communication links in the plant 10) to implement process control loops within the process plant 10. While the Fieldbus protocol, DeltaV system protocol, and Ovation system protocol use control modules and function blocks designed and implemented in an object oriented programming protocol, the control modules 29 could be designed using any desired control programming scheme including, for example, sequential function block, ladder logic, etc.; and are not limited to being designed and implemented using function blocks or any other particular programming technique.

II. The Plant

Figure 1B:
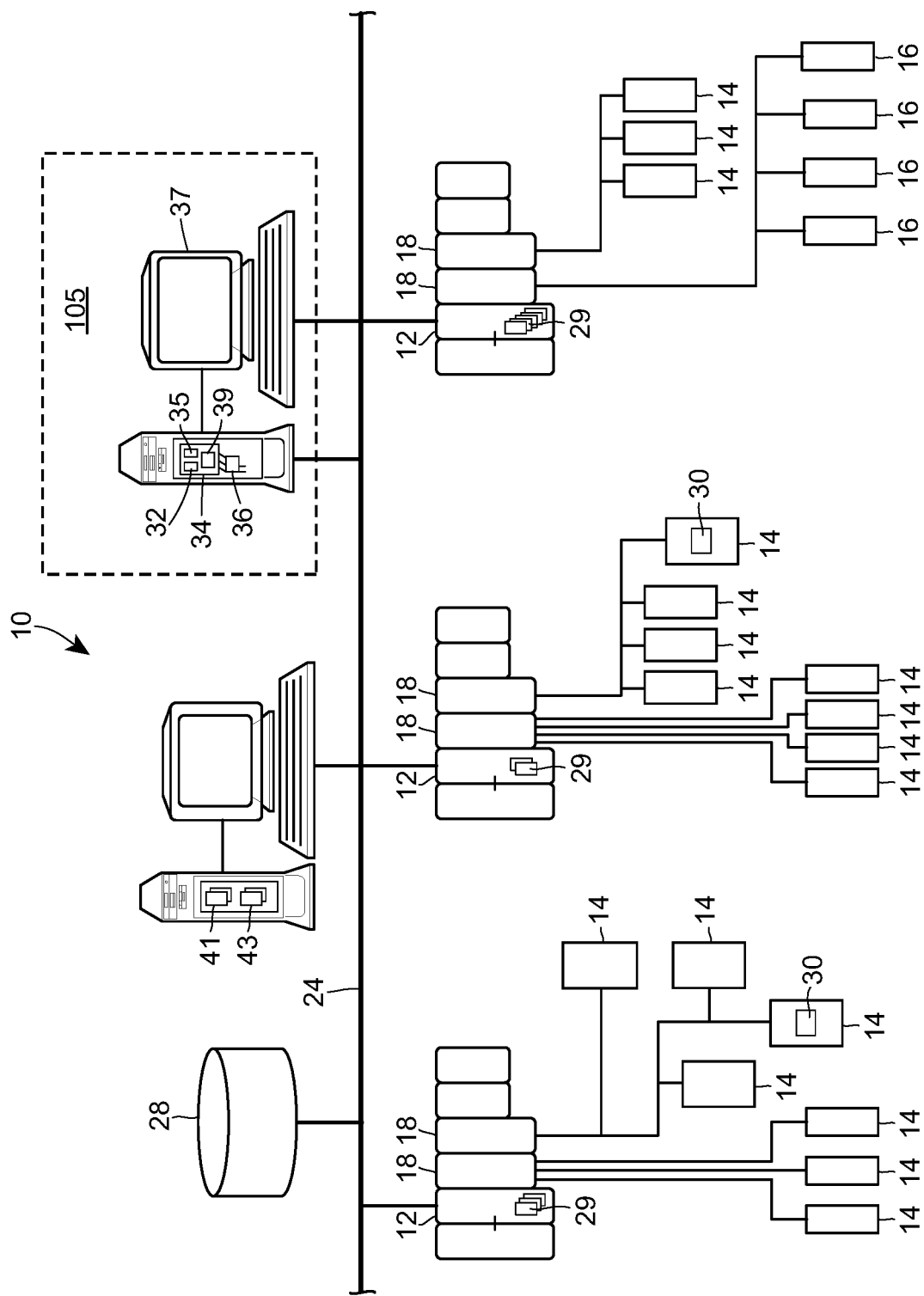
FIG. 1B is a block diagram of a distributed process control network located within a process plant according to an embodiment.

FIG. 1B is a block diagram of a distributed process control network located within a process plant 10 according to an embodiment. The process plant 10 may be designed using the plant builder 105 (also shown in FIG. 1A). The process plant 10 uses a distributed process control system including one or more controllers 12; one or more field devices 14; one or more input/output (I/O) devices (sometimes referred to as I/O cards) 18; the plant builder system 105; one or more hosts or operator workstations 22; a network 24; and a database 28.

The network 24 may be any suitable network, including wireless and/or wired links. The controllers 12, workstation 22, plant builder 105, and database 28 may be communicatively connected to the network 24, and may each be considered a node of the network 24 when connected. While the controllers 12, I/O cards 18, and field devices 14 are typically located within and distributed throughout the sometimes harsh plant environment, the plant builder 105, the operator workstation 22, and the database 28 are often located in control rooms or other less harsh environments easily assessable by controller or maintenance personnel.

A. The Controllers 12 and I/O Devices 18

Each of the controllers 12 (which may be by way of example, the DeltaV™ controller sold by Emerson Process Management) stores and executes a controller application that implements a control strategy using any number of different, independently executed, control modules or blocks 29. The one or more controllers 12 may be communicatively connected to the network 24, enabling the controllers 12 to communicate with other devices connected to the network 24, such as the workstation 22 or computer 20.

Further, the one or more controllers 12 may be communicatively connected to the field devices 14 using any desired hardware and software, including but not limited to: standard 4-20 ma devices; the I/O device 18; and/or any smart communication protocol. Each I/O device 18 may be any types of I/O device conforming to any desired communication or controller protocol. For example, the I/O devices 18 may be Fieldbus interfaces, Profibus interfaces, HART interfaces, WirelessHART interfaces, standard 4-20 ma interfaces, etc. In example operation, the controller 12 may implement a batch process or a continuous process using at least some of the field devices 14.

A. The Field Devices 14

Generally speaking, a field device 14 is a device used to monitor and/or control the process. A field device 14 generally is or includes an actuator, sensor, or some combination thereof. Each field device 14 is communicatively coupled to a controller 12 (typically via an I/O device 18, though a field device 14 may be directly coupled to a controller 12 in some embodiments). Some of the field devices 14 may have an associated microprocessor that handles communications with the controller 12 and/or I/O devices 18.

Generally speaking, an actuator (such as a pump or valve) actuates in response to a control signal from a controller 12, and a sensor outputs a measurement in response to detecting a physical phenomenon (e.g., a flow, temperature, or level of a material). The measurement is typically transmitted to a controller 12 via, for example, a transmitter coupled to the sensor.

The field devices 14 may be standard 4-20 ma devices; smart field devices, such as HART, Profibus, or FOUNDATION™ Fieldbus field devices, (which include a processor and a memory); or any other desired type of device. Some of these field devices 14, such as Fieldbus field devices, may store and execute modules, or sub-modules, such as the function blocks 30, associated with the control strategy implemented in the controllers 12. The function blocks 30 may be executed in conjunction with the execution of the control modules 29 within the controllers 12 to implement process control. In an embodiment, the function blocks 30 enable a field device 14 to function independent of a controller implementing a control routine.

In some embodiments, the plant 10 may include one or more wireless field devices (not shown) communicatively connected via a wireless gateway to the network 24.

B. The Workstation 22

The workstation 22 may be any computing device that operates as a user interface for operators or other users. The workstation 22 may include a processor and memory (not shown), and may include a user interface routine 41 and other applications 43. The user interface routine 41 enables the workstation 22 to accept input via an input interface (such as a mouse, keyboard, touchscreen, etc.) and provide output at a display.

In particular, the workstation 22 may provide output (i.e., visual representations or graphics) representing aspects of the process associated with the plant 10, allowing a user to monitor the process. The user may also affect control of the process by providing input at the workstation 22. To illustrate, the workstation 22 may provide graphics representing, for example, a tank filling process. In such a scenario, the user may read a tank level measurement and decide that the tank needs to be filled. The user may then, for example, interact with an inlet valve graphic displayed at the workstation 22 and input a command causing the inlet valve to open.

C. The Database 28

The database 28 is a collection of data that may be utilized by devices in the plant 10 for various purposes. The database 28 may be connected to the network 24 and may operate as a data historian that collects and stores parameter, status, and other data associated with the controllers 12 and field devices 14 within the plant 10 and/or as a configuration database that stores the current configuration of the process control system within the plant 10 as downloaded to and stored within the controllers 12 and field devices 14. A server (not shown) may access the database 28 and provide other devices access to the stored data. The server and/or database 28 may be hosted by a computer (not shown) similar to the workstation 22 or the computer 20.

D. The Plant Builder System 105

The plant builder 105 includes a computer 20 including a memory 34 and a processor 36. While FIG. 1B depicts the plant builder 105 including a single computer 20, it will be understood that the plant builder system 105 may include multiple computers in some embodiments.

The plant builder system 105 may accept input via an input interface (e.g., a keyboard, mouse, touchscreen, etc.) and may include or be coupled to a display screen 37. The memory 34 may store a plant builder routine 32, as well as P&IDs 35, equipment objects 39, and control modules 29. The memory 34 may also store other applications and/or data structures not shown.

The plant builder routine 32 is an application, routine, or module executed by the processor 36 to enable the creation and use of the P&IDs 35, equipment objects 39, and control modules 29. The plant builder routine 32 may be a single application or a suite of applications, depending on the embodiment. When the plant builder routine 32 is executed, the device executing the plant builder routine 32 may be referred to as a "plant builder system," "plant builder device," or "plant builder tool." For example, in some instances the workstation 22 may execute the plant builder routine 32, and may be referred to as a "plant builder tool" or "plant builder device" when executing the plant builder routine 32.

The plant builder routine 32 may be accessed by any authorized user (sometimes referred to herein as a configuration engineer or operator, although other types of users may exist) to view and provide functionality for the plant builder 105. The plant builder routine 32 may be implemented before other aspects of the plant 10 exist. That is, the plant builder routine 32 may be utilized to design the physical layout of the plant 10 and/or the communication scheme of the plant 10. The particular communication links between the controllers 12 and the field devices 14, for example, may be designed via the plant builder routine 32 before the controllers 12, the field devices 14, and the other equipment components are installed in the plant 10.

While the applications and data structures stored at the memory 34 are illustrated as being stored in the computer 20, some of these applications or other entities could be stored in and executed in other workstations or computer devices within or associated with the plant 10. Furthermore, the plant builder routine 32 can provide display outputs to the display screen 37 or any other desired display screen or display device, including hand-held devices, laptops, other workstations, printers, etc. Likewise, the plant builder routine 32 (as well as other applications stored at the memory 34) may be broken up and executed on two or more computers or machines and may be configured to operate in conjunction with one another.

Although the P&IDs 35 and equipment objects 39 are illustrated as being stored at the computer 20, they could be downloaded to and stored at any other computer associated with the process control plant 10, including laptops, hand-held devices, etc. In some instances, for example, the P&IDs 35 and/or process modules may be stored at the database 28.

Similarly, although the control modules 29 are illustrated as being stored and executed at the controllers 12, the control modules 29 could be stored and/or executed by other computing devices within the plant 10, particularly those connected to the network 24. For example, as previously noted, the control modules 29 may be stored and/or executed by the workstation 22 in some instances. Depending on the embodiment, the control modules 29 may be executed by a controller 12 or device that is wirelessly connected to the network 24.

III. A Prior Art Method for Plant Design

Figure 2:
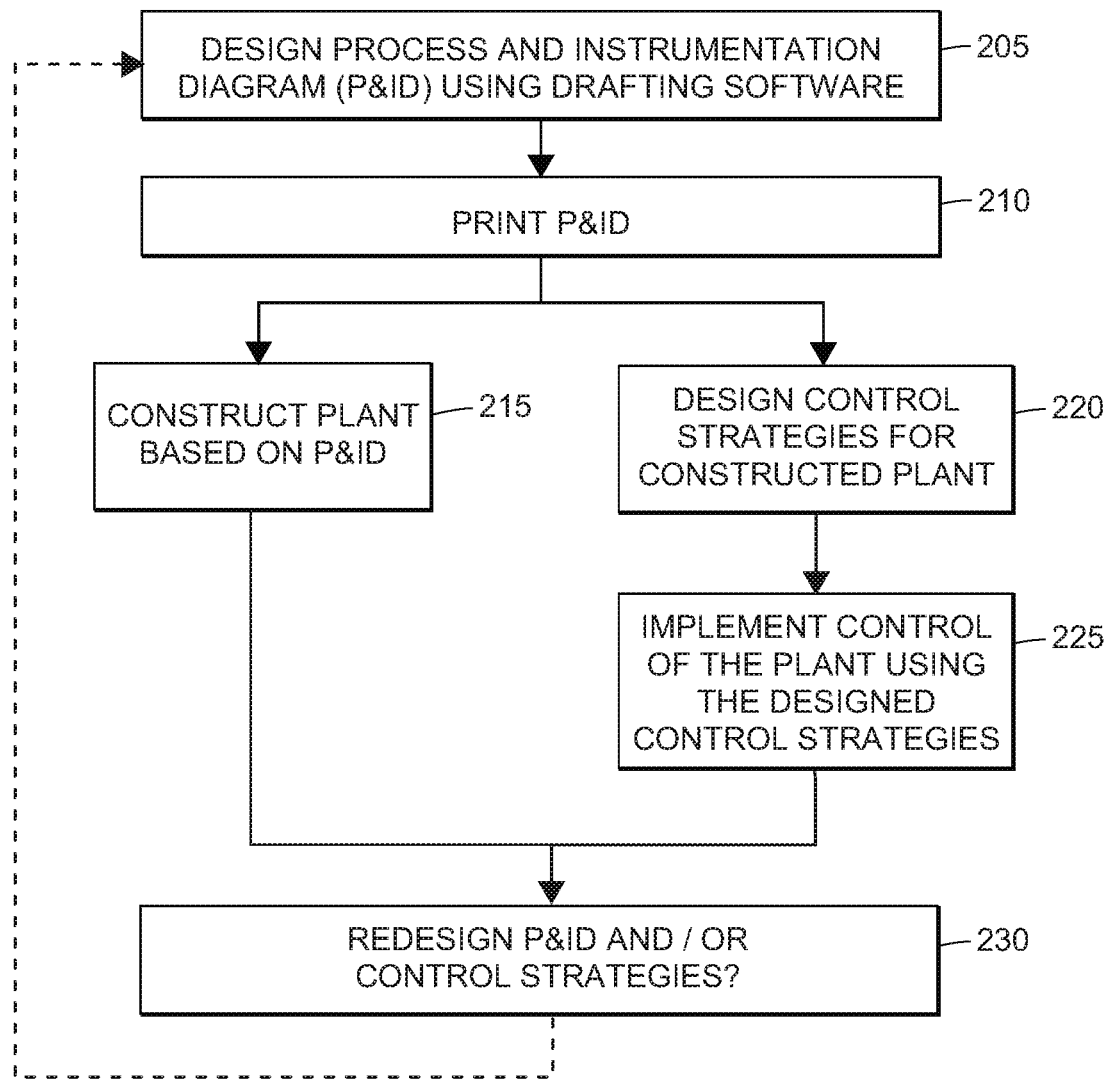
FIG. 2 is a flow chart of a prior art method for designing a plant.

FIG. 2 is a flow chart of a prior art method 200 for designing a plant. The method 200 begins with an engineer designing a P&ID using traditional stand-alone drafting software (block 205). The engineer then prints the P&ID (block 210). After all necessary P&IDs for the plant have been designed, the plant is constructed based on the P&IDs (block 215). That is, the tanks, pumps, valves, piping, etc. are installed according to the P&IDs. While the plant is under construction, a control engineer designs control strategies for controlling the constructed plant (block 222). Once the control strategies have been designed and the control system has been configured according to the designed control strategies, control of the plant is implemented using the designed control strategies (block 225). In some instances, the plant and/or control strategies may be less optimal than originally planned, and may require redesign (block 230). If new control strategies require new equipment or a reconfigured plant layout, construction may be undertaken to implement the new design. This additional construction can cost millions of dollars in labor, equipment, and opportunity cost associated with delayed plant production.

IV. Designing a Plant According to the Disclosed Embodiments

Various aspects of designing a plant via the plant builder 105 are described below with reference to FIGS. 3-8.

A. A Method 300 for Designing a Plant

Figure 3:
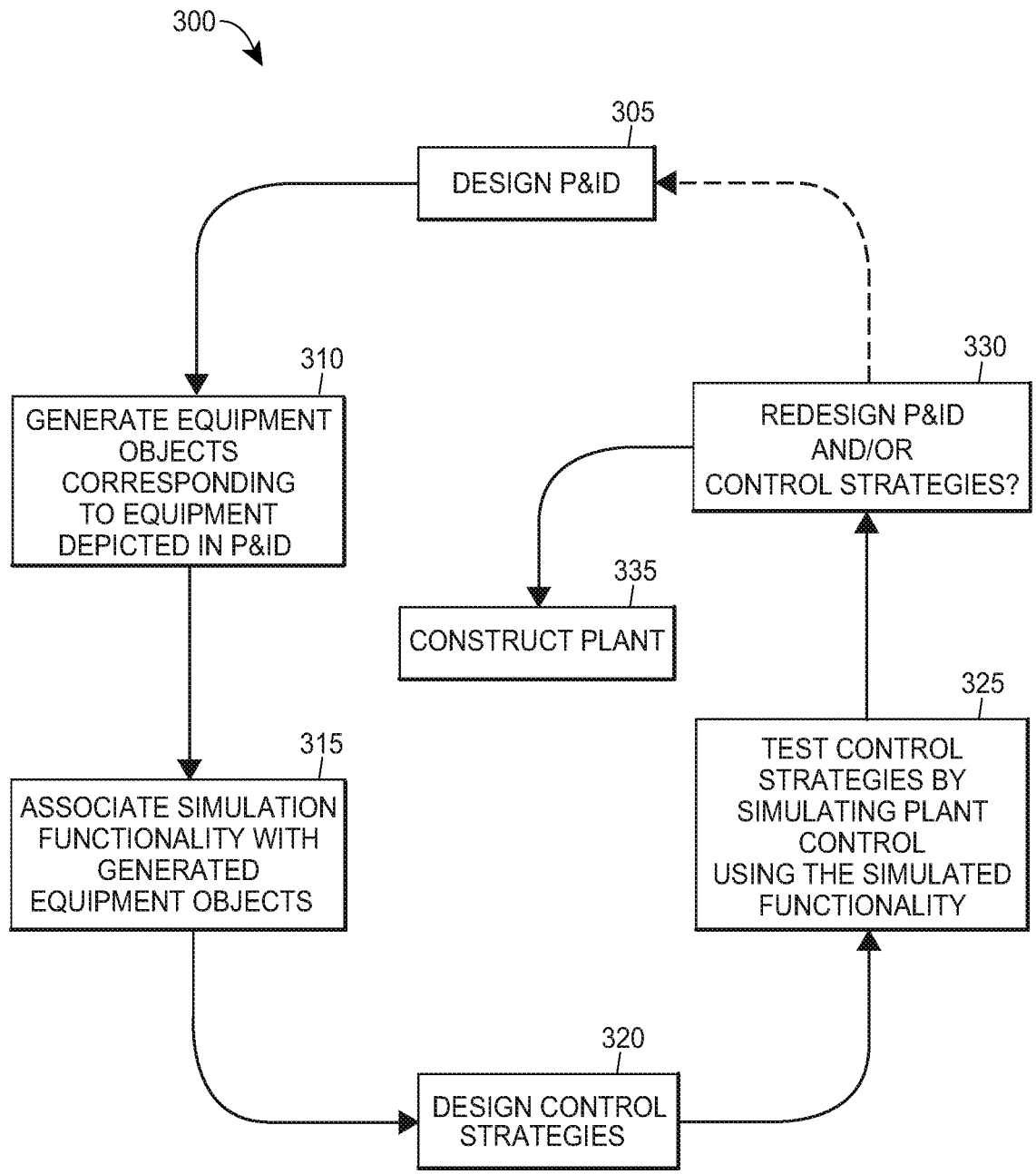
FIG. 3 is a flow chart of an example method for designing a plant according to an embodiment.

FIG. 3 is a flow chart of an example method 300 for designing a plant (e.g., the plant 10 shown in FIG. 1) according to an embodiment. The method 300 enables iterative plant design. Unlike the prior art method 200, for example, the method 300 facilitates extensive testing and simulation during the plant design process. The method 300 may be utilized to test multiple P&ID designs and control strategies before a plant is constructed, enabling engineers to optimize design and control of the plant before the plant is constructed.

1. Designing a P&ID (Block 305)

The method 300 begins with a user utilizing the plant builder 105 to design a P&ID 35 (shown in FIG. 1). Generally speaking, a user will design the P&ID 35 by placing various symbols (representing plant equipment components) in a configuration area provided as part of a user interface for the plant builder 105. These symbols generally depict various types or categories of process equipment components, such as valves, tanks, pumps, etc.

In some instances, a user may utilize a text entry box or dropdown menu to specify material connections for equipment represented by a symbol (e.g., to specify equipment physically upstream or downstream from the equipment represented by the symbol) and/or to specify communication connections for the equipment (e.g., to specify a means for communicating with equipment, such as a field device, represented by the symbol).

2. Generating Equipment Objects (Block 310)

The plant builder 105 may generate equipment objects 39 (shown in FIG. 1) corresponding to symbols in the P&ID 35 representing equipment components in the plant 10, or representing equipment components for potential installation in the plant 10. The plant builder 105 may generate the equipment objects 39 as the user is designing the P&ID 35. For example, the plant builder 105 may generate an equipment object 39 when a symbol (e.g., of a pump or valve) is dragged from a template library and dropped into a configuration area used for designing the P&ID 35.

In some embodiments, the plant builder 105 may generate equipment objects 39 after the user has finished designing the P&ID 35 (e.g., when the user saves the P&ID 35 to memory). The equipment objects 39 may be stored to memory of the plant builder system 105 (shown in FIG. 1). In an embodiment, the equipment objects 39 may be stored to the database 28 (shown in FIG. 1).

3. Associating Simulation Functionality with the Equipment Objects (Block 315)

The plant builder 105 may associate simulation functionality with the generated equipment objects 39. More particularly, the equipment objects 39 may be linked in a manner equivalent to that shown in the P&ID 35 to create a process module 31 corresponding, for example, to an area or unit represented by the P&ID 35. The created process module 31 may be associated with a simulator routine that a user can configure via the plant builder 32.

To create a process module 31, the plant builder 105 may link the equipment objects 39 based on links between symbols depicted in the P&ID 35. The plant builder 105 may provide an interface to enable a user to design and/or modify the simulation functionality provided by the process module simulator.

4. Designing Control Strategies (Block 320)

Control strategies may be designed via the plant builder 105. In particular, the plant builder 105 may be utilized to design the control modules 29 shown in FIG. 1. The control modules 29 may be comprised of function blocks. In particular, the control modules 29 may include input and/or output blocks that reference a field device 14 by referencing an equipment object 39. For example, an input block may reference an equipment object 39 representing a flow transmitter installed in the plant, enabling the input block to receive as an input a flow measurement from the flow transmitter. Similarly, an output block may reference an equipment object 39 representing a valve installed in the plant, enabling the output block to transmit a control signal as an output, wherein the control signal causes the valve to close, open, or otherwise change position, for example.

Further, an engineer may specify various control functions that affect the particular value of control signals transmitted by output blocks. In some instances these control functions may be predefined to a certain extent. For example, an engineer may specify a "tank level" control function including one or more predefined routines for filling and/or draining a tank. Depending on the embodiment, the engineer may customize such predefined control functions for the particular application in question. For example, an engineer may customize the predefined "tank level" control function by inputting a maximum tank capacity for the particular tank that will be controlled by the "tank level" control function.

5. Testing the Control Strategies (Block 325)

The control strategies are tested by simulating plant control using the simulated functionality associated with the generated equipment objects 39. To simulate plant control, the control modules 29 and the previously described simulation routine associated with a process module 31 may be executed. In a sense, the simulation routine maintains a simulation state for each of the equipment objects 39, each of which may change in response to received control signals and changes in simulation states of other equipment objects 39.

During simulation, the objects 39 in the process module 31 interact with the simulation routine associated with the objects 39 rather than actual field devices. That is, control outputs generated by the control modules 29 may be processed by the simulation routine rather than being sent to field devices 14, and control inputs received by the control modules 29 may be values or signals generated by the simulation routine rather than measurements obtained by the field devices 14.

For example, a control module 29 may be configured to transmit a control signal to a valve object 39. In normal operation, the control output would be forwarded to a valve corresponding to the valve object 39 (or to an I/O device associated with the valve). In simulation mode, however, the control output may be handled by the simulation routine rather than being transmitted to the valve. The simulation routine associated with the process module 31 may process the control output, simulating the valve actuating in response to the control output. The simulation routine may update a simulated valve state, for example. The simulation routine may also cause various other equipment objects 39 to respond to the simulated change to the valve position. For example, the simulation routine may include logic dictating that a tank fills when a simulated inlet valve opens. Various simulation outputs corresponding to process outputs (e.g., level measurements, temperature measurements, flow measurements, pressure measurements, etc.) may then respond to the simulated tank filling. In short, the simulation routine simulates actual operation of the process, and responds to control signals received from the control modules 29 accordingly.

6. Redesigning the P&ID and/or Control Strategies if Necessary (Block 330)

If needed, the P&ID and/or control strategies can be redesigned in light of the tests.

7. Constructing the Plant Based on the Designed P&IDs (Block 335)

Finally, the plant is constructed based on the designed (and potentially redesigned) P&IDs 35.

The method 300 may be implemented, in whole or in part, by one or more systems or devices described herein. For example, the method 300 includes operations that may be performed by the plant builder 105 shown in FIG. 1. A set of instructions (e.g., executable by a processor) for performing one or more operations of method 300 may be saved to memory, e.g., as one or more routines, applications, software modules, or programs. While the operations described above are in a sequential order, one skilled in the art will appreciate that it may be possible for the operations to be performed in alternative sequences.

B. A Relational Diagram of a System 400 for Designing a Plant

Figure 4:
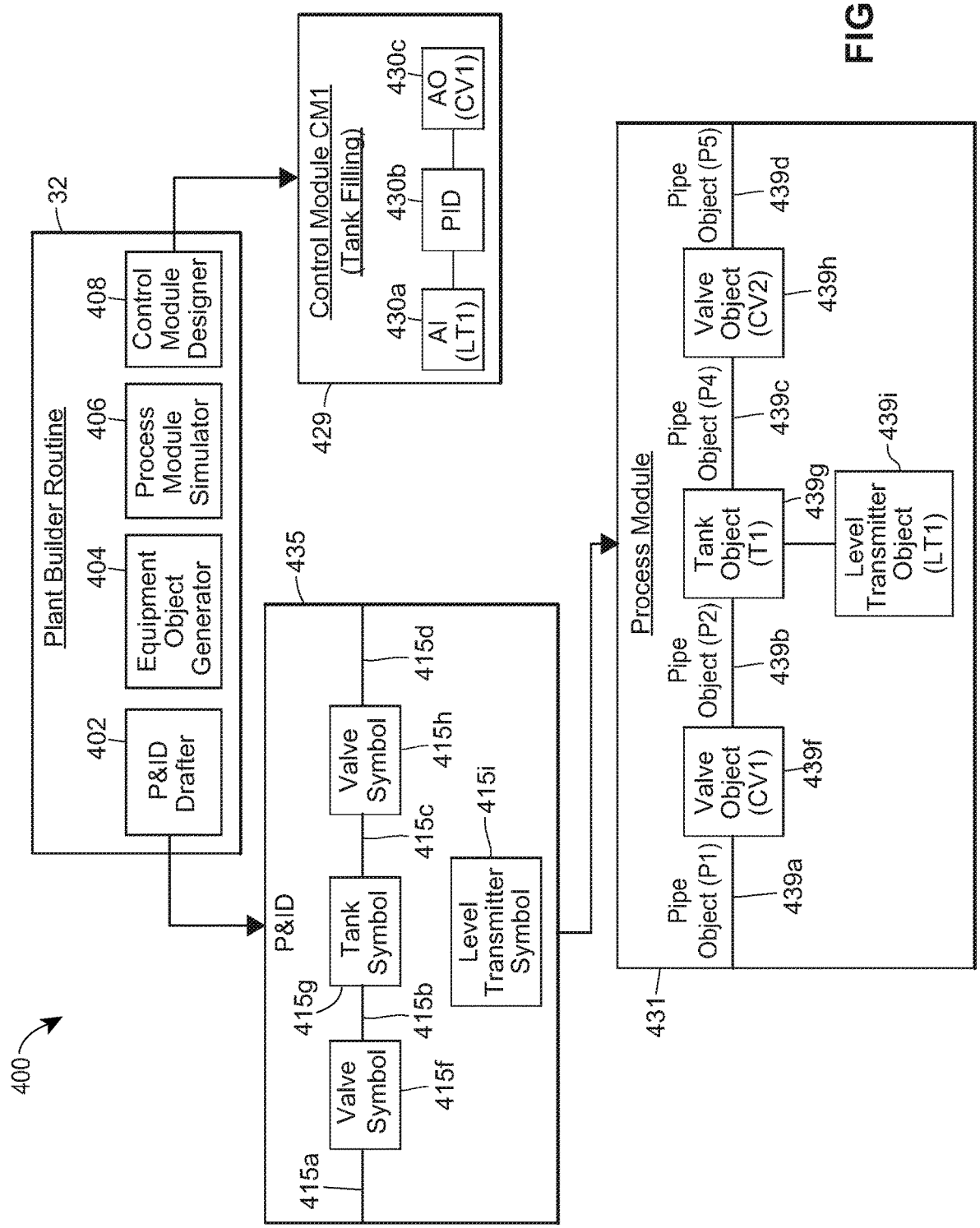
FIG. 4 is a relational diagram of a system for designing a plant according to an embodiment.

FIG. 4 is a relational diagram of a system 400 for designing a plant according to an embodiment. The system 400 includes the plant builder routine 32 (also shown in FIG. 1A), which may generate a P&ID 435, a process module 431, and/or a control module 429. The plant builder routine 32 may be implemented by the plant builder system 105 shown in FIGS. 1A and 1B.

The plant builder routine 32 may include various subroutines, such as a P&ID drafter subroutine 402, an equipment object generator subroutine 404, a process module simulator subroutine 406, and/or a control module designer subroutine 408. In some embodiments, one or more of these subroutines may be stand-alone applications that are part of a larger plant builder suite. The P&ID 435 represents a particular example of one of the P&IDs 35 shown in FIGS. 1A and 1B. Similarly, the process module 431, the control module 429, the equipment objects 439, the symbols 415, and the function blocks 430 represent particular examples of the process module 31, the control module 29, the equipment objects 39, the symbols 15, and the function blocks 430 shown in FIGS. 1A and 1B.

In example operation, the P&ID drafter subroutine 402 generates the P&ID 435 based on input from a user. The generated P&ID 435 may include one or more symbols 415a-i representing equipment components to be potentially installed in a plant (e.g., the equipment components 130 shown in FIG. 1A). In particular, the P&ID 435 may include pipe symbols 415a-415d, valve symbols 415f and 415h, a tank symbol 415g, and a level transmitter symbol 415i. Example symbols are described in more detail below with reference to FIG. 7.

Based on the particular design of the generated P&ID 435, the equipment object generator subroutine 404 generates one or more equipment objects 439a-439i. Each of the generated objects 439 corresponds to a symbol 415. The generator 404 may generate each object 439a-i as the respective symbol 415a-i is created. Alternatively, the generator 404 may generate the objects 439a-i after the symbols 415a-i have been created, linked, and saved, for example.

The equipment objects 439a-i may each have associated simulation functionality, which may be provided by the process module simulator subroutine 406. The simulator subroutine 406 subroutine is configured to simulate one or more equipment components, and may be implemented by the simulator 110 shown in FIG. 1A.

Further, one or more of the equipment objects 439a-i may be linked to equipment components after the equipment components are installed in the plant. For example, each of the equipment objects 439a-i may include a communication I/O element that can be configured to reference the equipment component (e.g., field device) corresponding to the particular equipment object 439a-i. The valve object 439f, for example, may include a communication I/O element that is configured (e.g., via the plant builder routine 32) to reference a valve installed in the plant. Accordingly, the object may be referenced or utilized to communicate with the corresponding valve (e.g., to send a control signal that causes the valve to open or close).

Moreover, the generator 404 may automatically configure the generated objects 439 so that they are linked according to physical relationships depicted by the P&ID 435. That is, the objects 439 may be linked according to the links between the symbols 415 in the P&ID 435. As a result, one or more of the generated objects 439 may be configured to have one or more different material I/O connections. For example, the valve object 439f may be configured to have two material I/O connections: the pipe object 439a and the pipe object 439b. These material I/O connections indicate that, when built, a valve (corresponding to the object 4390 may control material flow from a first pipe (correspond to the object 439a) to a second pipe (corresponding to the object 439b), or vice versa, depending on the particular configuration. Similarly, the process module simulator 406 may rely on material I/O connections between objects 439 to simulate material flow throughout the equipment components represented by the process module 431.

As noted, the objects 439 may be automatically generated and configured based on the particular design of the P&ID 435. For example, the P&ID 435 includes a valve symbol 415f linked to a pipe symbol 415b, which is linked to a tank symbol 415g. Based on these relationships between the symbols 415, the valve object 439f (corresponding to the valve symbol 415f) may be configured to be linked to the pipe object 439b (corresponding to the pipe symbol 415b), which may be configured to be linked to the tank object 439g (corresponding to the tank symbol 415g).

In some instances, a user may manually define material I/O connections for a given equipment object 439 using, for example, a drop-down box. For example, a user may utilize the plant builder routine 32 to link a transmitter or sensor not shown in the P&ID 435 to an equipment object 439. For example, the plant may have a flow transmitter that is associated with the valve represented by the valve object 439f but that is not depicted in the P&ID 435. In such an example, a user may link a flow transmitter to the valve object 439f. As another example, a plant may include equipment including a self-contained control system, such as a PLC. For example, a plant may include a boiler on a skid that is controlled by a PLC. While these self-contained control systems can generally be integrated into the larger control scheme of the plant, the P&ID 435 may depict equipment (e.g., the boiler) but not the corresponding self-contained control system (e.g., the PLC for the boiler). Accordingly, in such an example, a user may link a self-contained control system to equipment depicted in the P&ID 435. In some embodiments, the plant builder 32 may respond to the user linking non-depicted equipment by automatically updating the P&ID 435 to depict the newly added equipment. Example equipment objects are described in more detail with reference to FIGS. 5 and 6.

The control module designer subroutine 408 may generate the control module 429 based, for example, on user input. Generally speaking, the control module 429 is a control routine or set of routines configured to control one or more equipment components corresponding to the objects 439. The control module 429 may include one or more function blocks 430. In this case, the control module 429 includes an analog input (AI) block 430a, a PID block 430b, and an analog output (AO) block 430c.

The control module 429 is configured to perform a tank filling operation for a tank represented by the tank object 439g. In particular, the AI block 430a may be configured to receive a control input from the level transmitter object 439i. In normal operation, the object 439i may receive a measurement from a level sensor installed at the tank, and may forward that measurement to the AI block 430a. Of course, normal operation of the process using real equipment components installed in the plant only occurs after the equipment components have been installed in the plant and linked to the appropriate equipment objects 439 referenced by the function blocks 430.

During simulation mode, the level transmitter object 439i may receive a simulated measurement generated by the simulator 406, and may forward that simulated measurement to the AI block 430a. The AI block 430a may then pass the actual or simulated measurement to the PID block 430b.

The PID block 430b may execute logic to generate an output based on the actual or simulated measurement received from the AI block 430a. For example, the logic in the PID block 430b may be configured to generate an output to open an inlet valve (e.g., a valve corresponding to the valve object 439f) to fill the tank when the level measurement is low, and may generate an output to close the valve to stop filling the tank when the level measurement is high. The logic may account for other variables in some instances, such as a desired setpoint for tank level.

The generated output may be passed to the AO block 430c, which may be configured to reference the valve object 439f. Accordingly the AO block 430c may pass the generated output to the valve object 439f. When the valve object 439f is operating in normal mode, it will pass the output signal to a valve installed in the plant. When the valve object 439f is operating in simulation mode, it may pass the output signal to the simulator 406. The simulator 406 may then update a running simulation corresponding to the process module 431 based on the received output. For example, the simulator 406 may update a simulated valve state, which may affect simulated material flow through simulated pipes to which the valve is attached. To illustrate, an output signal to close a valve may cause the simulator 406 to slow or halt simulated material flow through pipes connected to a simulated tank, causing a simulated tank fill operation to slow down or stop.

Advantageously, the simulation functionality associated with the plant builder routine 32 enables iterative plant design. In particular, a user can design the P&ID 435 and control module 429 before installing the equipment components represented by the P&ID 435. This enables the user to test physical layouts and control strategies for the particular unit represented by the P&ID 435. Traditionally, design considerations regarding control strategies have not significantly factored into plant design decisions. In many cases, this would lead to the construction of a plant or plant area where the physical layout of the plant did not facilitate optimal control. The plant builder routine 32 remedies this plant design problem by enabling iterative process of designing, testing, and redesigning.

C. An Example Equipment Object 500

FIG. 5 is a block diagram of an example equipment object 500 that may be generated by the plant builder 105 shown in FIGS. 1A and 1B according to an embodiment. The equipment object 500 represents a particular example of one of the equipment objects 39 shown in FIGS. 1A and 1B. Each of the following entities may communicate with, utilize, or otherwise be associated with the equipment objects 500: other equipment objects 39 (also shown in FIGS. 1A and 1B); the P&ID drafter 402 (also shown in FIG. 4); the user interface routine 41 (also shown in FIG. 1B); one or more of the I/O devices 18 (also shown in FIG. 1B); one or more field devices 16 (also shown in FIGS. 1A and 1B); the simulator routine 406 (also shown in FIG. 4); and one or more control modules 29 (also shown in FIGS. 1A and 1B).

The equipment object 500 may include or reference various data. For example, the equipment object 500 may include at least one of: an ID 512, a graphic element 514, a material I/O element 516, a communication I/O element 518, and/or a simulation element 520.

Generally speaking, the ID 512 is a variable including an identifier or name unique to the equipment object 500. The ID 512 may sometimes be referred to as a tag. The ID 512 may include an code or identifier unique to a particular equipment type. For example, the ID 512 may be "CV500," wherein the letters "CV" indicate that the object 500 represents a control valve. The ID 512 may also include a string of numbers or letters, which may be unique to the object 500.

The graphic element 514 includes or references (e.g., via a pointer) a graphic representation of the equipment component corresponding to the object 500. The graphic representation may be generic in nature (e.g., a generic graphic of a valve), or may be more specific in nature (e.g., a detailed graphic of a particular valve). In some instances, the graphic may be the same graphic included in the P&ID that was used to generate the object 500. The graphic may be utilized by the user interface 41 to display a user interface for monitoring or controlling plant operation.

The material I/O element 516 includes or references other equipment objects 39 representing equipment components to which the equipment component represented by the object 500 is somehow physically connected. For example, if the object 500 represents a valve or tank, the material I/O element 516 may reference equipment objects 39 representing inlet and outlet pipes connected to the tank or valve. As another example, the material I/O element 516 may reference equipment objects 39 representing sensors or actuators attached or otherwise located in a close physical proximity relative to the underlying equipment component. For example, if the object 500 represents a tank, the material I/O element 516 may reference equipment objects 39 representing a pressure sensor that detects pressure within the tank, a level sensor that detects a liquid level within the tank, etc.

The communication I/O element 518 includes or references the equipment component corresponding to the object 500. For example, the communication I/O element 518 may include an address for communicating with an appropriate field device 14, or with an I/O device 18 coupled to the field device 14. Accordingly, the object 500 may be referenced (e.g., by a control module 29 implemented by controller) to communicate with a field device 14 (e.g., to send a control signal to the field device 14, or to receive a measurement from the field device 14). Note, in some instances, the object 500 may not reference a corresponding equipment component. For example, during the design stage, a corresponding equipment component might not yet exist, or might not yet be installed. Further, in some instances, the equipment component might not communicate with the object 500. For example, the object 500 may represent a tank that has no communication capabilities. In such an example, the object 500 may not communicate with the tank itself, and the communication I/O element 518 may not reference anything (e.g., may include a null value). With that said, the tank may have an associated level indicator, for example, which may be represented by another object 39 that references the level indicator and that can be utilized by a controller to receive measurements obtained by the level indicator.

The simulation element 520 includes or references simulation data and/or logic for simulating the equipment component corresponding to the object 500. The simulation element 520 may include or reference variables, objects, routines, etc. used to provide simulation functionality. To illustrate, the simulation element 520 may specify variables that can be written to and read, for example, when the object 500 is operating in simulation mode. Rather than sending a control signal to the corresponding equipment component, for example, the value of the control signal may be written to a variable, which can then be utilized by a simulation routine that is simulating part of the process. As another example, the simulation element 520 may reference a simulation routine (e.g., object, routine, subroutine, application, etc.) that is configured to simulate the corresponding equipment object. Control signals may be sent to, and measurements may be received from, this simulation routine. For example, a simulation routine may represent a flow sensor, and may include logic for simulating a flow measurement based on other simulation factors (e.g., the status of other simulated equipment objects). A simulation routine referenced by the simulation element 520 may provide a simulated flow measurement, which may be provided to a controller (e.g., to be processed by one or more control modules 29 implementing a control strategy).

D. A Block Diagram of the Equipment Object 439f

FIG. 6 is a block diagram of the example equipment object 439f (also shown in FIG. 4) that may be generated by the plant builder 105 shown in FIGS. 1A and 1B, according to an embodiment. The equipment object 439f represents a particular example of one of the equipment objects 39 shown in FIGS. 1A and 1B. The equipment object 439f may include one or more of: an ID 612, a graphic element 614, a material I/O element 616, a communication I/O element 618, and/or a simulation element 620. These elements are similar in nature to the elements 512-518 described with reference to FIG. 5. As noted with reference to FIG. 4, the equipment object 439f represents a particular valve installed, or planned for potential installation, in the plant.

The ID element 612 is a variable including a string 622, "CV1," that is unique to the object 439f. Other process entities (e.g., controllers, control modules, simulation routines, etc.) may reference the equipment object 439f by way of the string 622. The particular value of the string 622 ("CV1" in this case) may be specified by a user via the plant builder system 105. For example, the value of the string 622 may be specified when creating the P&ID 435 (shown in FIG. 4), and the plant builder tool 105 may utilize this string value for the ID element 612 when generating the equipment object 439f.

Figure 7:
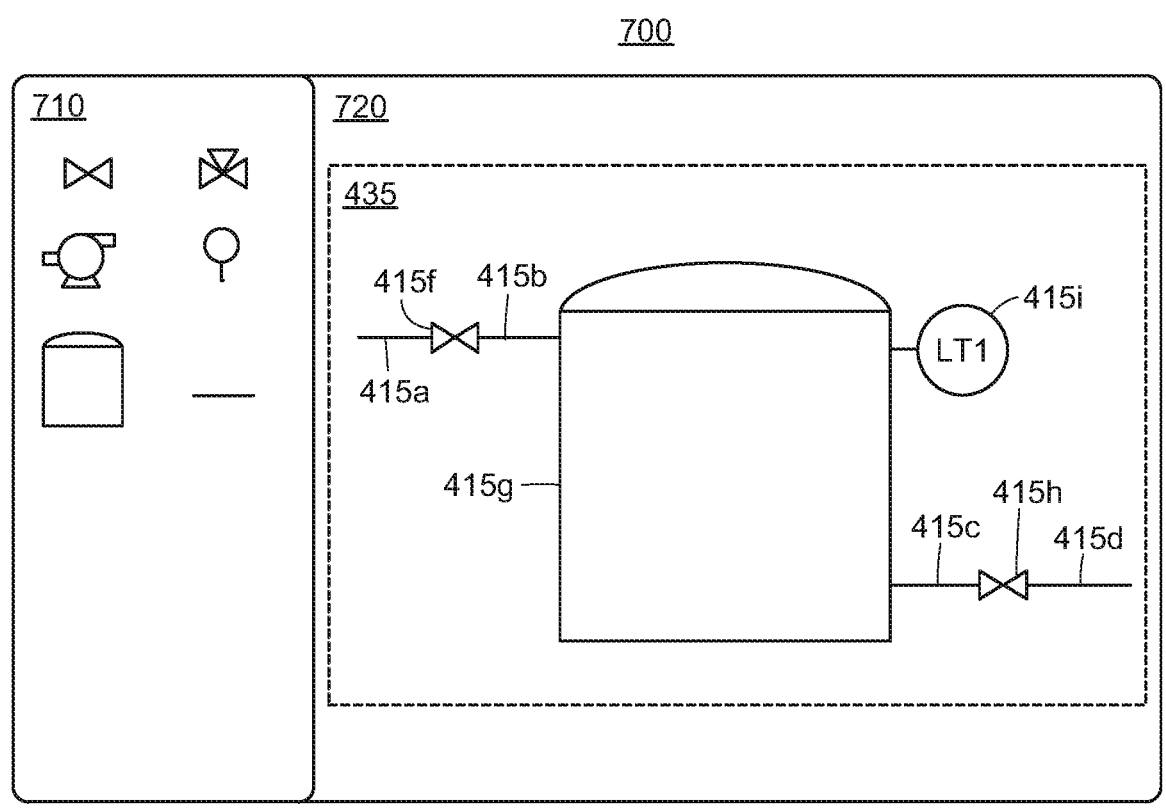
FIG. 7 depicts an example interface for a plant builder according to an embodiment.

The graphic element 614 includes or references a graphic 624. The graphic 624 may be the same graphic included in the P&ID 435, and may be utilized by the user interface 41 to provide a visualization of the equipment component corresponding to the object 439f. The particular graphic 624 chosen for the graphic element 614 may be chosen by a user via the plant builder system 105. For example, FIG. 7 illustrates an interface for the plant builder 105 that may be utilized to choose a graphic from a library or template area.

The material I/O element 616 includes or references other equipment objects 39 representing equipment components to which the equipment component represented by the equipment object 439f is connected. In particular, the material I/O element 626 includes a field or variable for specifying at least one material input 626 and one material output 628. The material input 626 specifies an object name "P1," which corresponds to the equipment object 439a shown in FIG. 4. Similarly, the material output 628 specifies an object name "P2," which corresponds to the equipment object 439b shown in FIG. 4. The material input(s) 626 and output(s) 628 may be populated by the plant builder 105 based on connections shown in the P&ID 435.

The communication I/O element 618 includes or references the equipment component corresponding to the object 439f. In particular, the communication I/O element 618 includes fields or variables for specifying communication inputs 630 and communication outputs 632. The communication outputs 632 for the object 439f include an address "AO Card 6, Address 02." This represents a particular address for a particular I/O device 18 coupled to the valve represented by the object 439f. Accordingly, when a control module 29 (shown in FIGS. 1A and 1B) references the object 439f to transmit a control signal, for example, the control signal may be transmitted to the particular address specified by the communication input 630, enabling the controller implementing the control module 29 to open or close the valve, for example. As shown, the object 439f is not configured to receive any communication inputs. This may indicate that the valve has no has no sensors or measurement functionality. In some instances, a valve may include a sensor, such as a flow sensor. In such an instance, the communication input 630 may include an address for communicating with the I/O device coupled to that sensor (e.g., an analog input card coupled to the flow sensor).

The simulation element 620 includes or references simulation data and/or logic for simulating the valve corresponding to the object 439f. For example, the simulation element 620 may include simulation input variables 634 and/or simulation output variables 636. When in simulation mode, these variables may be written to and/or read. For example, when in simulation mode, the control module 429 referencing the valve object 439f may transmit a control signal (e.g., a percentage indicating a valve position, such as 65% open). The value of this control signal may be written to the sim output 636 rather than transmitted to the communication output 632. The simulation routine 638 may then simulate a response of the process unit corresponding to the process module 431. As an example, the simulation routine 638 may simulate a tank (represented by the object 439g) filling when a control signal for opening the valve is received. The simulation routine 638 may then report a simulated tank level measurement to the level transmitter object 439i shown in FIG. 4. Consequently, a process module 431 can be simulated, enabling a designer to test plant designs and control strategies before constructing the area or unit corresponding to the process module 431.

Depending on the embodiment, the simulation element 620: (i) may reference the simulator 638 without explicitly referencing the simulation variables 634/636; (ii) may reference the simulation variables 634/636 without explicitly referencing the simulator 638; or (iii) may reference both the simulation variables 634/636 and the simulator 638.

E. An Example Interface 700 for the Plant Builder 105

FIG. 7 depicts an example interface 700 for the plant builder 105 according to an embodiment. The plant builder routine 105 provides the interface 700 (e.g., via the display screen 37 shown in FIG. 1) as part of the P&ID drafting routine or subroutine 402 shown in FIG. 4. The example interface 700 includes a library 710 and a configuration area 720. The library 710 includes a number of stencils or templates that may be dragged and dropped onto the configuration area 720 to create a P&ID 35. In the example shown, the configuration area 720 includes graphic symbols that have been arranged to create the P&ID 435 (also shown in FIG. 4).

Generally speaking, the template symbols included in the library 710 represent generic symbols for certain categories or classes of equipment components. For example, the library 710 may include template symbols for tanks, valves, transmitters, pumps, pipes, etc. These template symbols may be dragged and dropped onto the configuration area 720. Upon dropping a symbol onto the configuration area, a corresponding equipment object 439 may be instantiated. For example, when valve symbol 415f is dropped onto the configuration area 720, the valve object 439f may be instantiated. A user may then configure the instantiated object via, for example, a menu that can be activated by clicking on the symbol 415f. In an embodiment, the objects 439a-i are not instantiated until the entire P&ID 435 is created.

V. Additional Considerations

Throughout this specification, plural instances may implement components, operations, or structures described as a single instance. Although individual operations of one or more methods are illustrated and described as separate operations, one or more of the individual operations may be performed concurrently in certain embodiments.

As used herein, any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This description, and the claims that follow, should be read to include one or at least one. The singular also includes the plural unless it is obvious that it is meant otherwise.

References to a "memory" or "memory device" refer to a device including computer-readable media ("CRM"). "CRM" refers to a medium or media accessible by the relevant computing system for placing, keeping, and/or retrieving information (e.g., data, computer-readable instructions, program modules, applications, routines, etc.). Note, "CRM" refers to media that is non-transitory in nature, and does not refer to disembodied transitory signals, such as radio waves. The CRM of any of the disclosed memory devices may include volatile and/or nonvolatile media, and removable and/or non-removable media. The CRM may include, but is not limited to, RAM, ROM, EEPROM, flash memory, or other memory technology, CD-ROM, digital versatile disks (DVD) or other optical disk storage, magnetic cassettes, magnetic tape, magnetic disk storage or other magnetic storage devices, or any other medium which may be used to store information and which may be accessed by the computing system. One or more of the disclosed memory devices may be coupled to a processor via a memory interface. A memory interface is circuitry that manages the flow of data between the memory device and the bus of the computer system to which it is coupled.

A "communication link" or "link" is a pathway or medium connecting two or more nodes (e.g., a device or system connected to the network). A link may be a physical link and/or a logical link. A physical link is the interface and/or medium(s) over which information is transferred, and may be wired or wireless in nature. Examples of physicals links may include a cable with a conductor for transmission of electrical energy, a fiber optic connection for transmission of light, and/or a wireless electromagnetic signal that carries information via changes made to one or more properties of an electromagnetic wave(s).

A logical link between two or more nodes represents an abstraction of the underlying physical links and/or intermediary nodes connecting the two or more nodes. For example, two or more nodes may be logically coupled via a logical link. The logical link may be established via any combination of physical links and intermediary nodes (e.g., routers, switches, or other networking equipment).

A link is sometimes referred to as a "communication channel." In a wireless communication system, the term "communication channel" (or just "channel") generally refers to a particular frequency or frequency band. A carrier signal (or carrier wave) may be transmitted at the particular frequency or within the particular frequency band of the channel. In some instances, multiple signals may be transmitted over a single band/channel. For example, signals may sometimes be simultaneously transmitted over a single band/channel via different sub-bands or sub-channels. As another example, signals may sometimes be transmitted via the same band by allocating time slots over which respective transmitters and receivers use the band in question.

Words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

Although this detailed description contemplates various embodiments, it should be understood that the legal scope of any claimed system or method is defined by the words of the claims set forth at the end of this patent. This detailed description is to be construed as exemplary only and does not describe every possible embodiment, as describing every possible embodiment would be impractical, if not impossible.

What is claimed is:

1. A plant builder system comprising:
a display;
a processor communicatively coupled to the display;
a memory communicatively coupled to the processor, the memory storing:
(A) a process and instrumentation diagram ("P&ID") routine that when executed causes the display to display a configuration area to facilitate iterative design by a user of (i) a P&ID for a part of a plant based on a user's placement in the displayed configuration area of a plurality of equipment symbols representing a plurality of physical equipment components for the part of the plant; (ii) a control strategy to be implemented by the physical equipment components depicted in the P&ID, and (iii) simulation logic for simulating operation of the physical equipment components depicted in the P&ID; and
(B) an equipment object generator routine that when executed generates a plurality of executable equipment objects based on the plurality of equipment symbols placed in the configuration area, wherein the plurality of executable equipment objects is referencable to: (i) display, via the P&ID, the plurality of physical equipment components, (ii) control, via the control strategy, the plurality of physical equipment components, and (iii) simulate operation of the plurality of physical equipment components, such that the plurality of executable equipment objects enable iterative designing, testing, and redesigning of the part of the plant prior to installation of the plurality of physical equipment components;
wherein each of the plurality of equipment objects includes:
(i) a name element defined according to a name from the P&ID that is associated with a particular equipment symbol;
(ii) a graphic element defined according to the particular equipment symbol;
(iii) a material input/output ("I/O") element defined according to one or more of the plurality of connection symbols connected to the particular equipment symbol in the P&ID, the material I/O element defining material input flows and material output flows for the physical equipment component corresponding to the particular equipment symbol;
(iv) a simulation element that can be defined via user input to specify simulation behavior for the equipment object; and
(v) an undefined communication I/O element that can be defined to specify an address that can be utilized by a controller to communicate with the physical equipment component.

2. The system of claim 1, wherein the plant builder tool is further configured to define the communication I/O element according to user input specifying an I/O address utilized by the physical equipment component.

3. The system of claim 1, wherein the physical equipment component is one of: a valve, or a pump.

4. The system of claim 1, wherein the physical equipment component is one of: a temperature sensor, a pressure sensor, a level sensor, or a flow sensor.

5. The system of claim 1, wherein the memory further comprises a control module designer routine configured to define control routines for the process according to user input, wherein the control routines reference one or more of the plurality of equipment objects.

6. The system of claim 5, wherein the controller controls the process by communicating with the physical equipment components corresponding to the plurality of equipment objects referenced by the defined control routines.

7. The system of claim 5, further comprising a simulator configured to simulate execution of the process based on: (i) the defined control routines referencing one or more of the plurality of equipment objects, and (ii) the simulation elements for the one or more of the plurality of equipment objects referenced by the defined control routines.

8. A method comprising:
   presenting a configuration area at a display to facilitate iterative design by a user of: (i) a process and instrumentation diagram ("P&ID"), representing equipment for an area of a plant, based on the user's placement in the displayed configuration area of a plurality of equipment symbols, (ii) a control strategy to be implemented by the equipment depicted in the P&ID, and (iii) simulation logic for simulating operation of the equipment depicted in the P&ID;
   generating a plurality of executable equipment objects, representing the plurality of equipment components, that are referenceable to (i) display, via the P&ID, the plurality of physical equipment components, (ii) control, via the control strategy, the plurality of physical equipment components, and (iii) simulate operation of the plurality of physical equipment components, such that the plurality of executable equipment objects enable iterative designing, testing, and redesigning of the part of the plant prior to installation of the plurality of physical equipment components;
   wherein the generating includes generating, via one or more processors coupled to the display, an executable equipment object corresponding to a physical equipment component represented by a particular equipment symbol from the plurality of equipment symbols in the P&ID, the generated equipment object referencable to both control and simulate the physical equipment component, the generated equipment object including:
      (i) a name element defined according to a name from the P&ID that is associated with the particular equipment symbol;
      (ii) a graphic element defined according to the particular equipment symbol;
      (iii) a material input/output ("I/O") element defined according to one or more of the plurality of connection symbols connected to the particular equipment symbol in the P&ID, the material I/O element defining material input flows and material output flows for a physical equipment component corresponding to the particular equipment symbol;
      (iv) a simulation element that can be defined via user input to specify simulation behavior for the equipment object; and
      (v) an undefined communication I/O element that can be defined to enable a controller to communicate with the physical equipment component; and
   implementing, by way of the executable equipment object, control of the physical equipment component or simulation of the physical equipment component.

9. The method of claim 8, further including defining the communication I/O element according to user input specifying an I/O address utilized by the physical equipment component.

10. The method of claim 8, wherein the physical equipment component is one of: a valve, or a pump.

11. The method of claim 8, wherein the physical equipment component is one of: a temperature sensor, a pressure sensor, a level sensor, or a flow sensor.

12. The method of claim 8, further comprising defining control routines for the process according to user input, wherein the control routines reference one or more of the plurality of equipment objects.

13. The method of claim 12, further comprising controlling the process by communicating, via the controller, with the physical equipment components corresponding to the plurality of equipment objects referenced by the defined control routines.

14. The method of claim 8, further comprising simulating execution of the process based on: (i) the defined control routines referencing one or more of the plurality of equipment objects, and (ii) the simulation elements defined for the one or more of the plurality of equipment objects referenced by the defined control routines.

15. A method for facilitating iterative design of a process control plant, the method comprising:
   (A) implementing, via one or more computer systems, a plant builder tool configured to facilitate iterative design of an area of a plant that is not yet constructed, wherein said implementing includes performing the following prior to constructing the area:
      (i) receiving, via a user interface of the plant builder tool, user input representing a first design for a process and instrumentation diagram ("P&ID") depicting equipment to be installed in the area;
      (ii) receiving, via user interface, user input representing a second design for a control strategy to be implemented by the equipment depicted in the P&ID;
      (iii) receiving, via the user interface, user input representing a third design for simulation logic for simulating operation of the equipment depicted in the P&ID;
      (iv) generating a set of equipment objects representing the first, second, and third designs;
      (v) simulating operation of the area utilizing the set of equipment objects prior to the equipment depicted in the P&ID being installed at the area; and
      (vi) responding to user input representing a redesign of the first design, the second design, or the third design by updating the set of equipment objects to represent the modification prior to the equipment depicted in the P&ID being installed at the area, such that the plant builder tool enables a user to iteratively design, test, and redesign the first, second, and third designs; and
   (B) storing to a memory the set of equipment objects such that it is referencable to (i) display the first design of the P&ID to enable construction of the area according to the P&ID, (ii) implement the control strategy to control the area; and (iii) simulate operation of the area.

* * * * *